US011946956B2

(12) United States Patent
Itou et al.

(10) Patent No.: US 11,946,956 B2
(45) Date of Patent: Apr. 2, 2024

(54) SIGNAL DETECTION CIRCUIT

(71) Applicant: DENSO CORPORATION, Kariya (JP)

(72) Inventors: Takasuke Itou, Kariya (JP); Tomohiro Nezuka, Kariya (JP); Yasuaki Aoki, Kariya (JP); Yuuta Nakamura, Kariya (JP); Takashi Yoshiya, Kariya (JP)

(73) Assignee: DENSO CORPORATION, Kariya (JP)

( * ) Notice: Subject to any disclaimer, the term of this patent is extended or adjusted under 35 U.S.C. 154(b) by 308 days.

(21) Appl. No.: 17/545,033

(22) Filed: Dec. 8, 2021

(65) Prior Publication Data

US 2022/0091162 A1 Mar. 24, 2022

Related U.S. Application Data

(63) Continuation of application No. PCT/JP2020/023034, filed on Jun. 11, 2020.

(30) Foreign Application Priority Data

Jun. 17, 2019 (JP) .................................. 2019-111975

(51) Int. Cl.
*G01R 19/165* (2006.01)
*H03F 3/04* (2006.01)
*H03K 5/24* (2006.01)

(52) U.S. Cl.
CPC ............. *G01R 19/165* (2013.01); *H03F 3/04* (2013.01); *H03K 5/24* (2013.01)

(58) Field of Classification Search
None
See application file for complete search history.

(56) References Cited

U.S. PATENT DOCUMENTS

| 2008/0143577 A1* | 6/2008 | Tomisawa | H03K 5/249 |
| | | | 341/165 |
| 2009/0179699 A1* | 7/2009 | Higuchi | H03K 5/2481 |
| | | | 330/260 |
| 2019/0089346 A1 | 3/2019 | Kawai | |
| 2022/0094309 A1* | 3/2022 | Itou | H03K 17/16 |

* cited by examiner

*Primary Examiner* — Jermele M Hollington
*Assistant Examiner* — Suresh K Rajaputra
(74) *Attorney, Agent, or Firm* — POSZ LAW GROUP, PLC

(57) ABSTRACT

A signal detection circuit detects, as a detection target signal, a signal of a main terminal of a switching element by comparing the detection target signal with a reference signal. The signal detection circuit includes: a signal generation unit generating the reference signal; a first capacitor having a first terminal connected with the main terminal of the switching element; a second capacitor having a first terminal connected with an output terminal of the signal generation unit; and a detection circuit receiving, as input signals, a signal output from a second terminal of the first capacitor and a signal output from a second terminal of the second capacitor, and the detection circuit detecting the detection target signal based on the input signals.

10 Claims, 22 Drawing Sheets

SIGNAL DETECTION CIRCUIT

CROSS REFERENCE TO RELATED APPLICATION

The present application is a continuation application of International Patent Application No. PCT/JP2020/023034 filed on Jun. 11, 2020, which designated the U.S. and claims the benefit of priority from Japanese Patent Application No. 2019-111975 filed on Jun. 17, 2019. The entire disclosures of all of the above applications are incorporated herein by reference.

TECHNICAL FIELD

The present disclosure relates to a signal detection circuit that detects a signal of a main terminal of a switching element.

BACKGROUND

Conventionally, a circuit that adjusts an applying time of a signal to a gate of a switching element based on a detection result of a voltage between a drain and a source of the switching element is known.

SUMMARY

The present disclosure provides a signal detection circuit that detects, as a detection target signal, a signal of a main terminal of a switching element by comparing the detection target signal with a reference signal. The signal detection circuit includes: a signal generation unit generating the reference signal; a first capacitor having a first terminal connected with the main terminal of the switching element; a second capacitor having a first terminal connected with an output terminal of the signal generation unit; and a detection circuit receiving, as input signals, a signal output from a second terminal of the first capacitor and a signal output from a second terminal of the second capacitor, and the detection circuit detecting the detection target signal based on the input signals.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
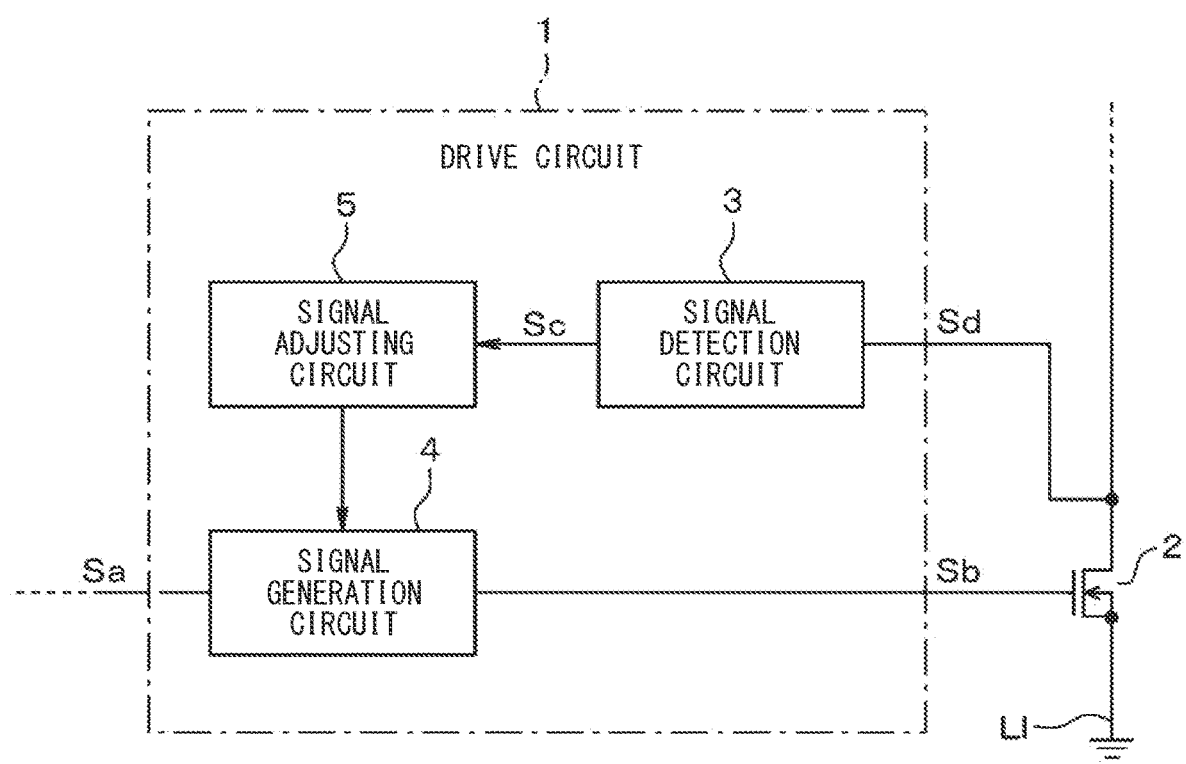
FIG. 1 is a diagram schematically showing a configuration of a drive circuit according to a first embodiment.

There has been known a configuration that adjusts an applying time of a signal to a gate of a switching element based on a detection result of a voltage between a drain and a source of the switching element, such as MOSFET. The voltage between the drain and source of the switching element is also known as a load signal. In such a configuration, a signal detection circuit, which is a circuit for detecting the load signal of the switching element, is used.

In the above-described signal detection circuit, when a relatively high voltage is generated between the drain and the source, that is, usage in a high voltage application, a high withstand voltage element having a relatively high withstand voltage is required to be used. Thus, an increase in circuit area may occur for integrating the high withstand voltage element as an integrated circuit (IC). Conventionally, it has been considered to provide a voltage dividing circuit including an element such as a capacitor on an input side of the signal detection circuit in order to reduce the voltage between the drain and the source before inputting the voltage to the signal detection circuit.

The above-described conventional configuration has the following difficulties. In a configuration where a capacitor or the like configuring the voltage dividing circuit is mounted as an external component of an integrated circuit (IC), a miniaturization of the signal detection circuit as a whole may be difficult. Further, when a capacitor or the like configuring the voltage dividing circuit is built in the IC, a capacitance of the capacitor must be reduced. This may cause a decrease in signal detection accuracy due to an influence of the parasitic capacitance.

According to an aspect of the present disclosure, a signal detection circuit detects, as a detection target signal, a signal of a main terminal of a switching element by comparing the detection target signal with a reference signal. The signal detection circuit includes: a signal generation unit generating the reference signal; a first capacitor having a first terminal connected with the main terminal of the switching element; a second capacitor having a first terminal connected with an output terminal of the signal generation unit; and a detection circuit receiving, as input signals, a signal output from a second terminal of the first capacitor and a signal output from a second terminal of the second capacitor, and the detection circuit detecting the detection target signal based on the input signals.

In the above configuration, both of the detection target signal and the reference signal are input to the detection circuit via the respective capacitors. Therefore, both of the detection target signal and the reference signal input to the detection circuit are affected by the parasitic capacitance at the same level. In the above configuration, the detection target signal is detected by comparing the detection target signal with the reference signal. Thus, it is possible to reduce the influence of the parasitic capacitance on the detection accuracy of the detection target signal. Therefore, elements including the first capacitor and the second capacitor configuring the signal detection circuit of the above configuration can be integrated together. According to the above configuration, it is possible to obtain an excellent effect that the detection accuracy can be improved while suppressing an increase in circuit size.

The following will describe embodiments of the present disclosure with reference to the accompanying drawings. In each embodiment, the substantially same components are denoted by the same reference numerals and description thereof will be omitted.

First Embodiment

Hereinafter, the first embodiment will be described with reference to FIG. 1 to FIG. 3.
(General Configuration)
As shown in FIG. 1, in the present embodiment, a drive circuit 1 drives a low-side switching element 2. The low-side switching element 2 and a high-side switching element configure a half-bridge circuit connected between a pair of direct current power supply lines. The switching element 2 is a semiconductor switching element. In the present embodiment, the switching element 2 is provided by an n-channel MOSFET. The switching element 2 includes a drain as one of main terminals, and the drain is connected to the DC power supply line on a high potential side via a high-side switching element (not shown) disposed on a high side. The switching element 2 includes a source as the other one of main terminals, and the source is connected to the DC power supply line LI on a low potential side.

In the present embodiment, a relatively high voltage of, for example, several hundred volts is applied between the pair of DC power supply lines described above. That is, the switching element 2 is used for high voltage applications. The drive circuit 1 drives the switching element 2 by generating a gate signal Sb based on a control signal Sa or the like provided from an external source, and applying the gate signal Sb to the gate of the switching element 2.

The drive circuit 1 is configured as a semiconductor integrated circuit, that is, an IC, and includes a signal detection circuit 3, a signal generation circuit 4, a signal adjusting circuit 5, and the like. The signal of the main terminal of the switching element 2, that is, the signal Sd of the drain of the switching element 2 is input to the signal detection circuit 3. Therefore, the signal Sd corresponds to a detection target signal to be detected by the signal detection circuit 3. In this configuration, the signal detection circuit 3 detects the signal Sd with the potential of the DC power supply line LI, that is, the source voltage of the switching element 2 as a reference potential.

In the present embodiment, the detection target signal to be detected by the signal detection circuit 3 is a drain voltage detected with the source voltage of the switching element 2 as a reference. That is, the detection target signal is a voltage VDS between the drain and the source of the switching element 2. The detection target signal may be a current flowing through the switching element 2 or a combination of the voltage and the current. The signal detection circuit 3 outputs a detection signal Sc that corresponds to a detection result of the detection target signal. The detection signal Sc is a binary signal that inverts in response to the voltage VDS reaching a predetermined reference voltage Vref. As described above, the signal detection circuit 3 is configured to detect the voltage VDS, which corresponds to the detection target signal, by comparing the detection target signal with the reference voltage Vref, which corresponds to the reference signal.

By using the detection signal Sc output from the signal detection circuit 3, it is possible to detect whether a peak value of the voltage VDS exceeds a predetermined upper limit. The reference voltage Vref may be set to have a voltage value corresponding to the above-described upper limit. Further, by using the detection signal Sc output from the signal detection circuit 3, it is possible to detect a slew rate of the voltage VDS at the time of turn-on or turn-off of the switching element 2, that is, during a period of the switching operation. The reference voltage Vref is switched to multiple voltage levels during the turn-on or turn-off period of the switching element 2. With this configuration, it is possible to acquire the time at which the voltage VDS reaches each voltage level based on the detection signal Sc, and the slew rate of the voltage VDS can be detected each time the voltage VDS reaches the corresponding voltage level.

The signal generation circuit 4 generates a gate signal Sb based on a control signal Sa provided from an external source. The gate signal Sb is used to turn on or turn off the switching element 2 in a complementary manner with the high-side switching element (not shown). The signal adjusting circuit 5 adjusts the gate signal Sb generated in the signal generation circuit 4 based on the detection signal Sc output from the signal detection circuit 3. The signal adjusting circuit 5 switches a resistance of a gate resistance (not shown) provided in a supply path of the gate signal Sb according to the detection signal Sc. That is, the signal adjusting circuit 5 switches a drive capability of the drive circuit 1 according to the detection signal Sc.

The following will describe the adjustment of the gate signal by the signal adjusting circuit 5. The signal adjusting circuit 5 detects whether the peak value of the voltage VDS during the switching operation of the switching element 2 exceeds the upper limit based on the detection signal Sc. In response to detection of the peak value exceeding the upper limit, the signal adjusting circuit 5 increases the resistance of the gate resistor to decrease the drive capability of the drive circuit 1. In response to detection of the peak value not exceeding the upper limit, the signal adjusting circuit 5 decreases the resistance of the gate resistor to increase the drive capability of the driver circuit 1. With this configuration, the peak value of the voltage VDS during the switching operation of the switching element 2 can be controlled to be less than a predetermined upper limit, that is, to be an optimum value.

The signal adjusting circuit 5 detects the slew rate of the voltage VDS during the switching operation of the switching element 2 based on the detection signal Sc. When the detected slew rate is equal to or higher than a predetermined threshold, the signal adjusting circuit 5 increases the resistance of the gate resistance to decrease the drive capability of the drive circuit 1. When the detected slew rate is lower than the predetermined threshold, the signal adjusting circuit 5 decreases the resistance of the gate resistance to increase the drive capability of the drive circuit 1. With this configuration, the slew rate of the voltage VDS during the switching operation of the switching element 2 can be controlled to be lower than a predetermined threshold value, that is, to be an optimum value.

(Configuration of Signal Detection Circuit)

Figure 2:
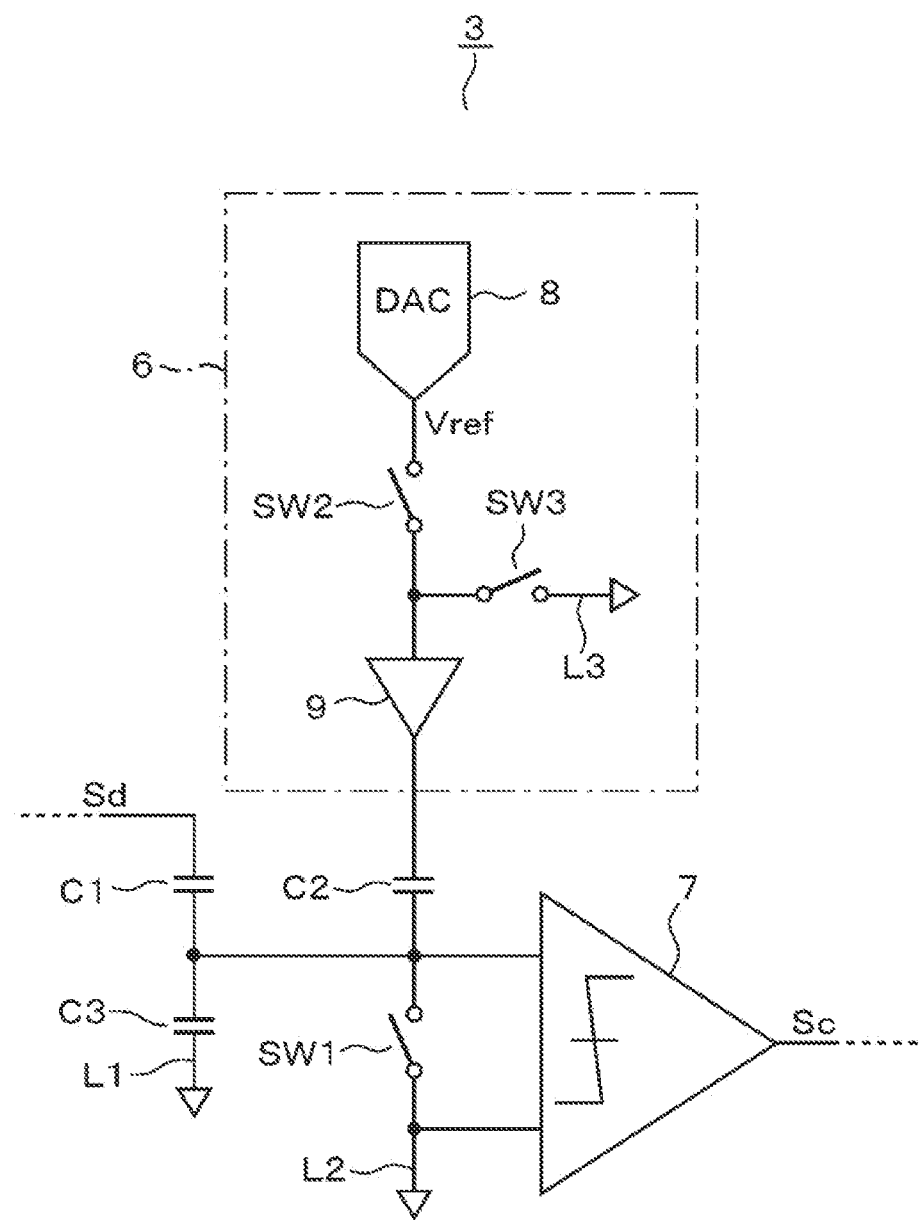
FIG. 2 is a diagram schematically showing an exemplary configuration of a signal detection circuit according to the first embodiment.
Figure 3:
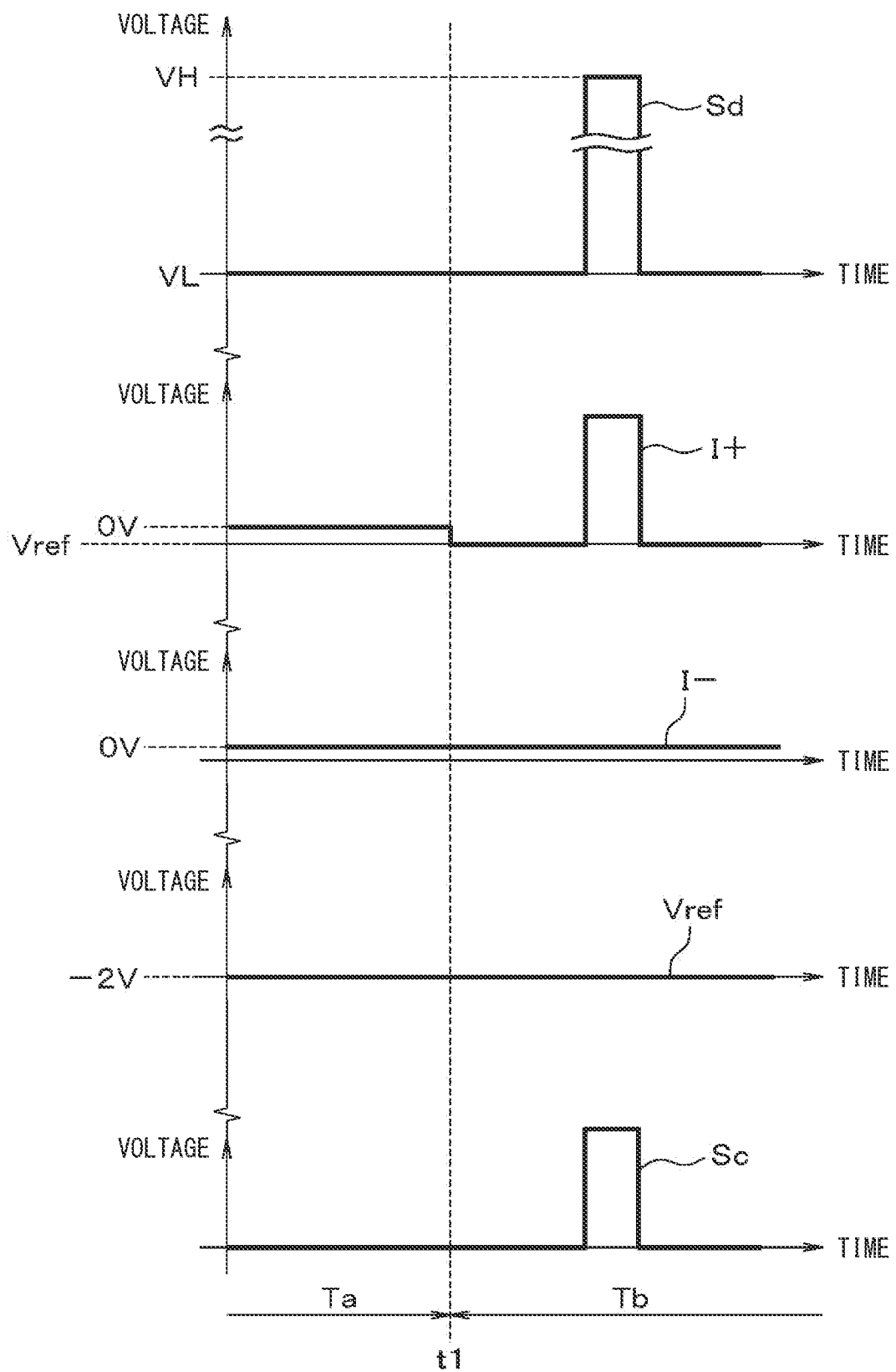
FIG. 3 is a diagram showing time charts of signals at respective points during execution of a detection operation according to the first embodiment.

As a specific configuration of the signal detection circuit 3, a configuration shown in FIG. 2 can be adopted as an example. As shown in FIG. 2, the signal detection circuit 3 includes a signal generation unit 6, capacitors C1 to C3, a switch SW1, and a comparator 7. The signal generation unit 6 generates and outputs a reference voltage Vref. The signal generation unit 6 includes a digital-to-analog converter 8, switches SW2, SW3, and a buffer 9. In the present disclosure, the digital-to-analog converter may also be referred to as a DAC.

The signal generation unit 6 is configured to output an analog voltage generated by the DAC 8 as the reference voltage Vref. Specifically, the signal generation unit 6 has the following configuration. A digital signal corresponding to an expected reference voltage Vref is input to the DAC 8. Thus, DAC 8 can output the reference voltage Vref, which has an expected analog voltage value. An output terminal of the DAC 8 is connected to an input terminal of the buffer 9 via the switch SW2. The input terminal of the buffer 9 is connected to a power supply line L3 via the switch SW3. Thus, a predetermined reference potential of the power supply line L3 is applied to the input terminal of the buffer via the switch SW3. An output terminal of the buffer 9 corresponds to an output terminal of the signal generation unit 6.

The capacitor C1 corresponds to a first capacitor, and one terminal of the first capacitor C1 is connected to the drain of the switching element 2. The capacitor C2 corresponds to a second capacitor, and one terminal is connected to the output terminal of the signal generation unit 6. The other terminal of the capacitor C1 and the other terminal of the capacitor C2 are connected to one input terminal of the comparator 7.

The capacitor C3 is connected between one input terminal of the comparator 7 and a power supply line L1. A predetermined reference potential is applied to the power supply line L1. The capacitors C1 and C3 configure a voltage dividing circuit that divides the signal Sd, specifically, the voltage VDS.

The other input terminal of the comparator 7 is connected to a power supply line L2. A predetermined reference potential is applied to the power supply line L2. The reference potentials applied to the power supply lines L1, L2, L3 may be the same as a reference potential of the circuit, that is, a ground voltage of 0 Volt. The switch SW1 is connected between the two input terminals of the comparator 7. As described above, the signal of the other terminal of the capacitor C1 and the signal of the other terminal of the capacitor C2 are input to the comparator 7 as input signals. The comparator 7 outputs a binary signal that changes according to the input signals. The output signal of the comparator 7 corresponds to the detection signal Sc. In the present embodiment, the comparator 7 functions as a detection circuit that receives, as the input signals, the signals output from the other terminals of the capacitors C1 and C2, and detects the detection target signals based on the input signals.

The detection operation executed by the signal detection circuit 3 having the above-described configuration will be described with reference to FIG. 3. FIG. 3 shows signals in a case where an operating state of the switching element 2 switches from a turn-on state to a turn-off state, and then switches from the turn-off state to the turn-on state again. In this case, the input signal applied to one input terminal of the comparator 7 is shown as I1+, and the input signal applied to the other input terminal of the comparator 7 is shown as I1−.

During the detection operation of the signal detection circuit 3, the switches SW1 to SW3 are controlled to turn on and turn off as follows. In a turn-on state of the switching element 2, during a period Ta up to a time point t1, the switches SW1 and SW3 are in on states and the switch SW2 is in off state. In a period Tb starting from the time point t1, the switches SW1 and SW3 are in off states, and the switch SW2 is in on state.

During the period Ta and the period Tb, regardless of turn-on or turn-off states of the switches SW1 to SW3, the signal Sd corresponding to the drain voltage of the switching element 2 has the voltage VL (for example, 0 Volt) of the DC power supply line LI during the on state of the switching element 2 and has the voltage VH (for example, several hundreds volts) of the high potential side DC power supply line during the off state of the switching element 2. The voltage dividing circuit configured by the capacitors C1 and C3 divides the signal Sd, and outputs a voltage division signal to one input terminal of the comparator 7. Thus, in the present embodiment, as circuit components, low withstand voltage elements having relatively low withstand voltages can be used in a stage of the circuit subsequent to the voltage dividing circuits.

During the period Ta, the switches SW1 and SW3 are set to turn-on states. Thus, the potential of the power supply line L2 (for example, 0 Volt) is applied to one terminal of the capacitor C2, and the potential of the power supply line L3 (for example, 0 Volt) is applied to the other terminal of the capacitor C2. Thus, electric charge stored in the capacitor C2 is discharged and the capacitor C2 initialized. During the period Ta, one input terminal of the comparator 7 is connected to the power supply line L2 via the switch SW1, and the input signal I+ of the comparator 7 becomes 0 Volt.

Throughout the periods Ta and Tb, the input signal I− of the comparator is 0 Volt regardless of whether the switches SW1 to SW3 are in on states or in off states. In the present embodiment, for example, the reference voltage Vref generated by the DAC 8 may be set to −2 Volts.

When the period Tb starts after end of the period Ta, the reference voltage Vref generated by the DAC 8 is applied to the other terminal of the capacitor C2 via the switch SW2 and the buffer 9. During the period Tb, the reference voltage Vref is applied to one input terminal of the comparator 7 via the capacitor C2. The voltage division signal obtained by dividing the signal Sd is applied to one input terminal of the comparator 7 via the capacitor C1. During the period Tb, the input signal I+ is obtained by adding the value of the reference voltage Vref (for example, −2 Volts) to the value of the division voltage signal obtained by dividing the signal Sd. That is, a voltage value obtained by assigning an offset corresponding to the reference voltage Vref to the voltage division signal is input to the comparator 7 as the input signal I+.

The value of the reference voltage Vref is set so that the input signal I+ and the input signal I− intersect with one another at a time when the voltage VDS reaches the reference voltage Vref. The comparator 7 is configured to output a binary signal having a high level during a period in which the voltage of one input terminal is higher than the voltage of the other input terminal. Therefore, the detection signal Sc output from the comparator 7 has a low level when the voltage VDS is lower than the reference voltage Vref, and the detection signal Sc has a high level when the voltage VDS is equal to or higher than the reference voltage Vref. That is, the detection signal Sc is a binary signal, and the level of detection signal Sc inverts in response to the voltage VDS reaching the reference voltage Vref.

The above-described embodiment provides the following effect.

The signal detection circuit 3 of the present embodiment includes the signal generation unit 6 which generates and outputs the reference voltage Vref, the capacitor C1 having one terminal connected with the drain of the switching element 2, the capacitor C2 having one terminal connected with the output terminal of the signal generation unit 6, and the comparator 7. The comparator 7 receives the signal from the other terminal of the capacitor C1 and the signal from the other terminal of the capacitor C2, and detects the detection target signal based on the received signals.

In the above configuration, the drain signal Sd of the switching element 2 is input to the comparator 7 via the capacitor C1, and the reference voltage Vref is input to the comparator 7 via the capacitor C2. Thus, both of the signal Sd and the reference voltage Vref to be input to the comparator 7 are affected by the parasitic capacitance caused by the input terminal of the comparator 7 at the same level.

In the signal detection circuit 3 having the above configuration, the detection target signal, that is, the voltage VDS is detected by comparing with the reference voltage Vref. Thus, adverse influence of the parasitic capacitance on the detection accuracy of the detection target signal can be suppressed. Thus, elements including the capacitor C1 and the capacitor C2 configuring the signal detection circuit 3 of the above configuration can be integrated together to have a compact circuit size. According to the present embodiment, it is possible to obtain an excellent effect that the detection accuracy can be improved while suppressing an increase in circuit size.

Second Embodiment

Figure 4:
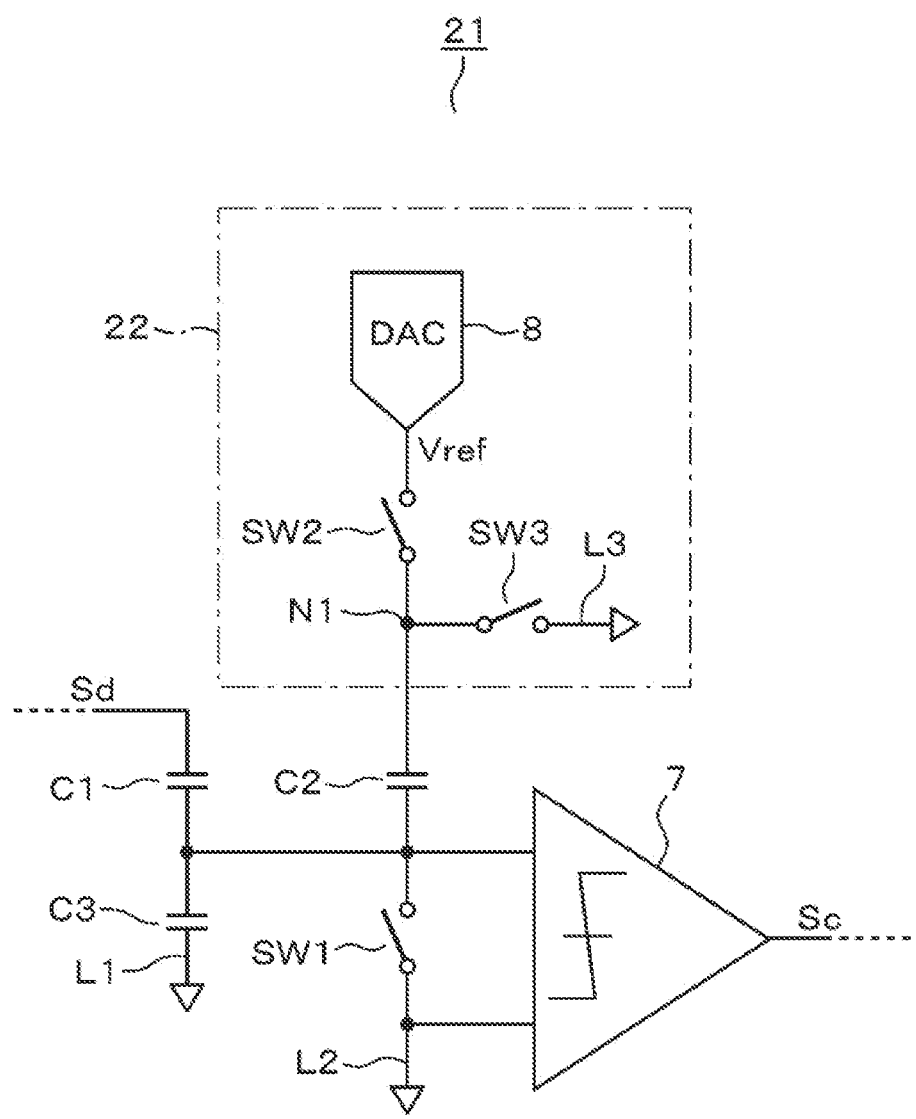
FIG. 4 is a diagram schematically showing an exemplary configuration of a signal detection circuit according to a second embodiment.
Figure 5:
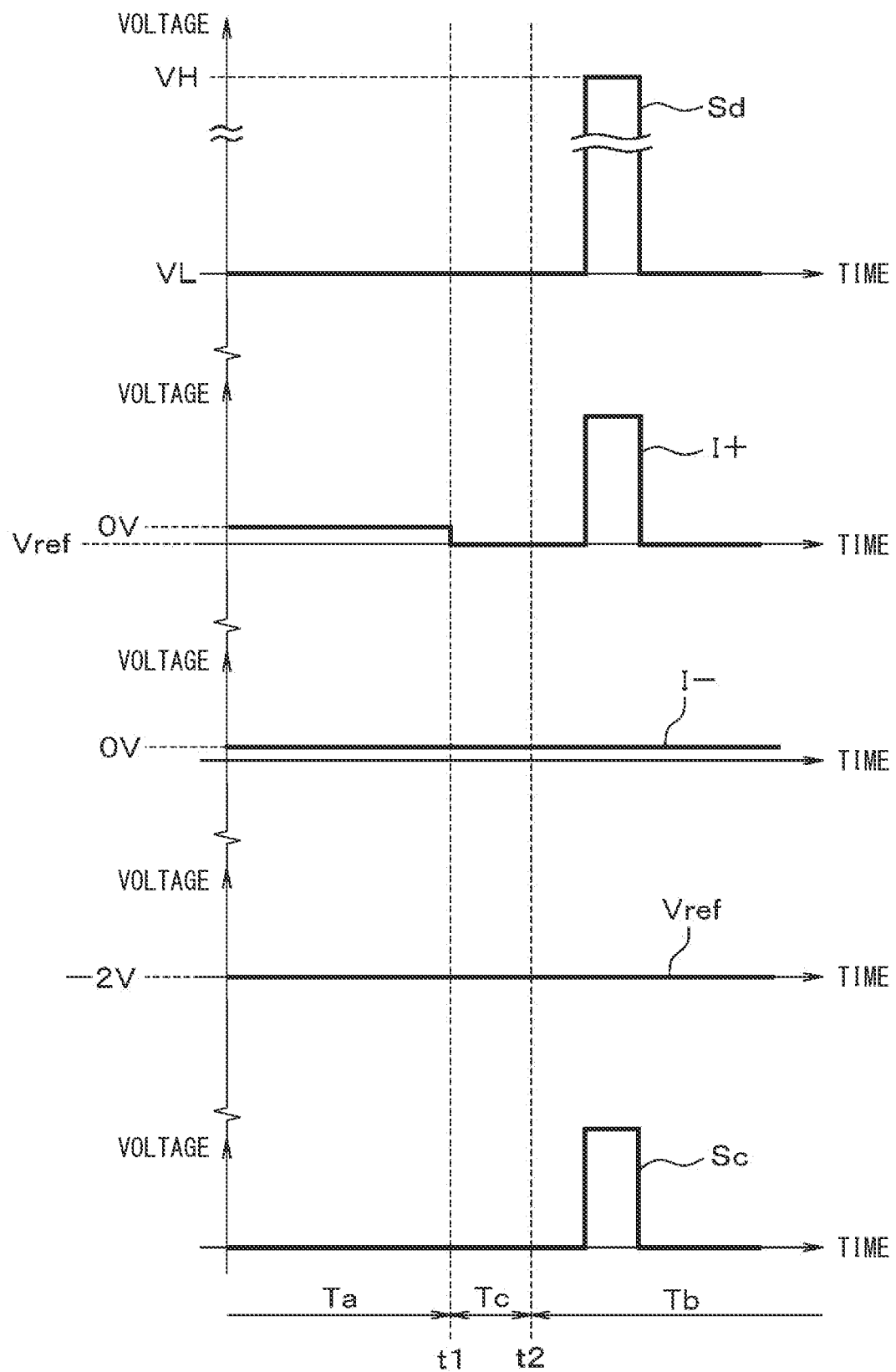
FIG. 5 is a diagram showing time charts of signals at respective points during execution of a detection operation according to the second embodiment.

The following will describe a second embodiment of the present disclosure with reference to FIG. 4 and FIG. 5. In the second embodiment, a configuration of the signal detection circuit is changed from the first embodiment.

As shown in FIG. 4, a signal detection circuit 21 of the present embodiment includes a signal generation unit 22 instead of the signal generation unit 6 that is included in the signal detection circuit 3 of the first embodiment shown in FIG. 2. The signal generation unit 22 according to the present embodiment does not include the buffer 9 compared with the signal generation unit 6 of the first embodiment. In the present embodiment, the output terminal of the DAC 8 is connected to a node N1 via the switch SW2. The node N1 is connected to the power supply line L3 via the switch SW3. The node N1 corresponds to the output terminal of the signal generation unit 22.

The detection operation executed by the signal detection circuit 21 having the above-described configuration will be described with reference to FIG. 5. In the configuration of the present embodiment, since the signal generation unit 22 does not include the buffer 9, turn-on and turn-off control of the switches SW1 to SW3 is different from that of the first embodiment. In the present embodiment, after the period Ta is ended, a period Tc start from the time point t1, and the period Tc ends at a time point t2. The time point t2 is prior to a time point when the switching element 2 is switched from the turn-on state to the turn-off state. After the period Tc is ended, the period Tb starts from the time point t2. During the period Ta, the switches SW1 and SW3 are in turn-on states, and the switch SW2 is in turn-off state. During the period Tc, the switches SW1 and SW3 are in turn-off states, and the switch SW2 is in turn-on state. During the period Tb, the switches SW1 and SW2 are in turn-off states, and the switch SW3 is in turn-on state.

During the period Ta, since the switches SW1 and SW3 are in turn-on states as in the first embodiment, the electric charge stored in the capacitor C2 is discharged and the capacitor C2 is initialized. Similar to the first embodiment, during the period Ta, one input terminal of the comparator 7 is connected to the power supply line L2 via the switch SW1, and the input signal I+ of the comparator 7 becomes 0 Volt. Similar to the first embodiment, the input signal I− of the comparator 7 is 0 Volts regardless of whether the switches SW1 to SW3 are in turn-on states or in turn-off states. Similar to the first embodiment, in the present embodiment, for example, the reference voltage Vref generated by the DAC 8 may be set to −2 Volts.

When the period Ta ends and the period Tc starts, the capacitor C2 is charged by the reference voltage Vref output from the DAC 8. Thus, the electric charge corresponding to the reference voltage Vref (for example, −2 Volts) is stored in the capacitor C2. Then, when the period Tc ends and the period Tb starts, the potential of the power supply line L3 (for example, 0 Volt) is applied to one terminal of the capacitor C2. Thus, during the period Tb, the reference voltage Vref is applied to one input terminal of the comparator 7 via the capacitor C2.

In the present embodiment, the input signals I+, I− are input to the comparator 7 in the same manner as the signals of the first embodiment. The detection signal Sc output from the signal detection circuit 21 of the present embodiment is a binary signal that inverts in response to the voltage VDS reaching the reference voltage Vref, similarly to the detection signal Sc output from the signal detection circuit 3 of the first embodiment.

The present embodiment also provides the same effects as those of the first embodiment. The signal generation unit 22 of the present embodiment does not include the buffer 9, and includes the DAC 8 and the switches SW2 and SW3 only.

Therefore, the signal generation unit 22 has a smaller circuit size than the signal generation unit 6 which includes the buffer 9 in the first embodiment. Therefore, according to the present embodiment, it is possible to further suppress an increase in circuit size compared with the first embodiment.

Third Embodiment

Figure 6:
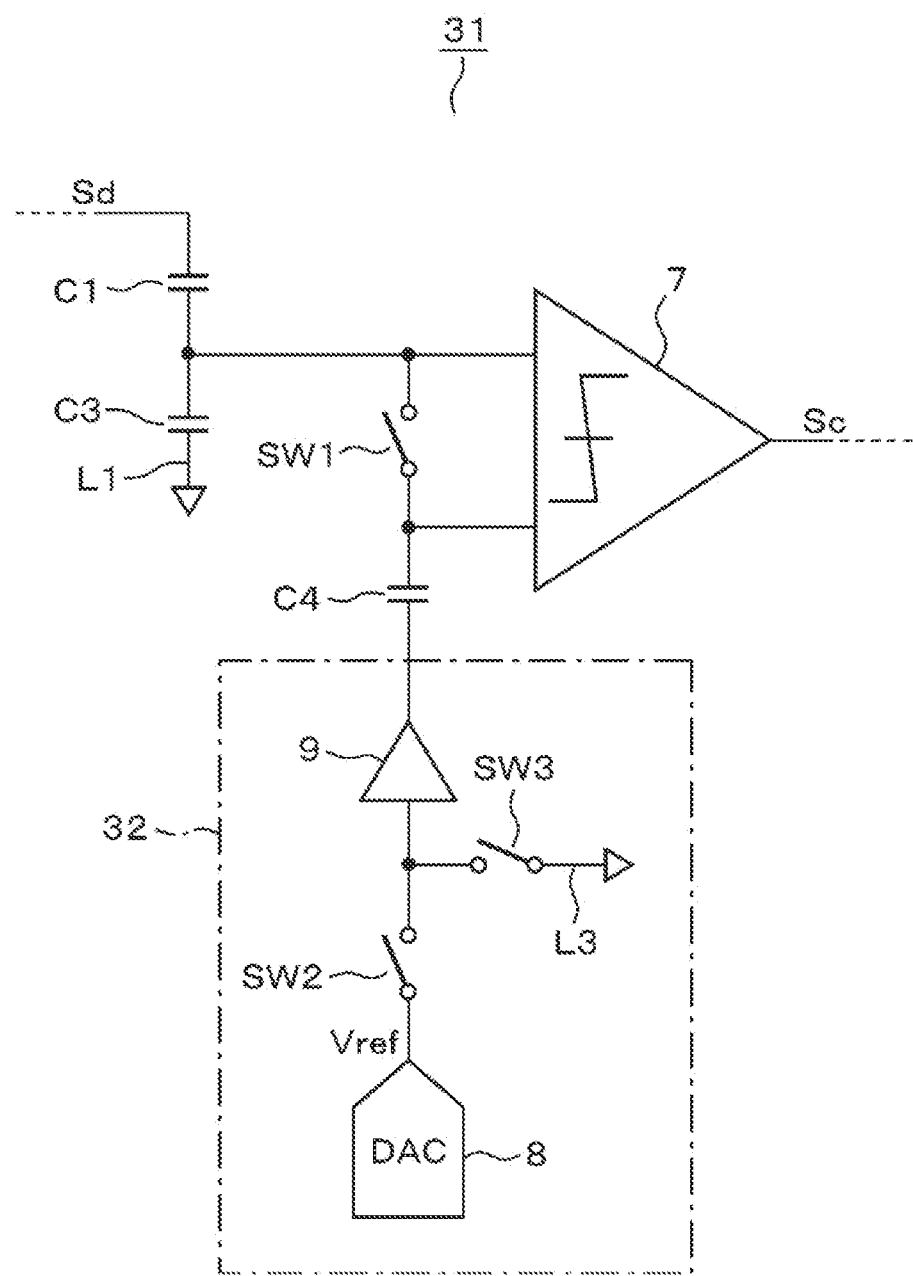
FIG. 6 is a diagram schematically showing an exemplary configuration of a signal detection circuit according to a third embodiment.
Figure 7:
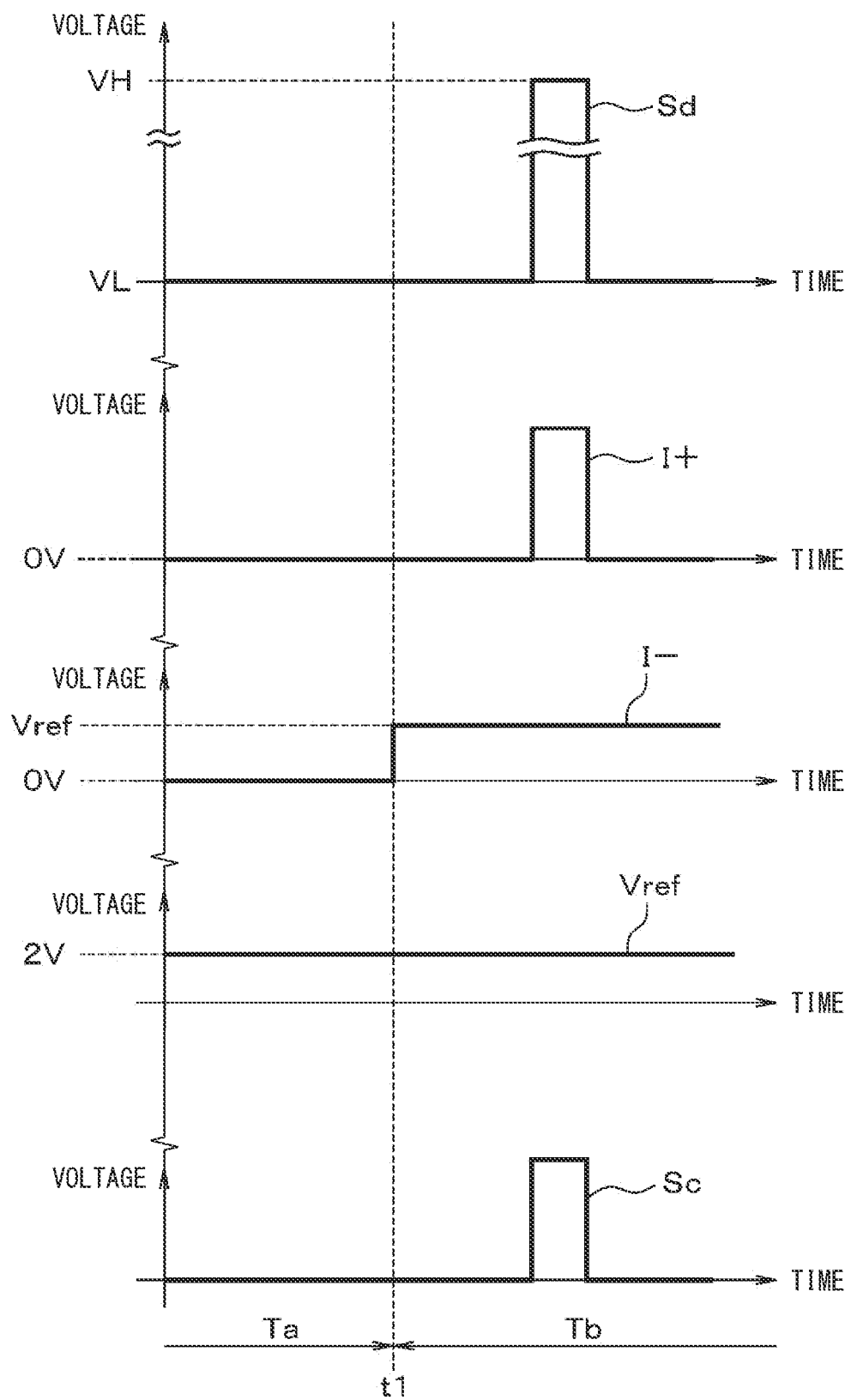
FIG. 7 is a diagram showing time charts of signals at respective points during execution of a detection operation according to the third embodiment.
Figure 8:
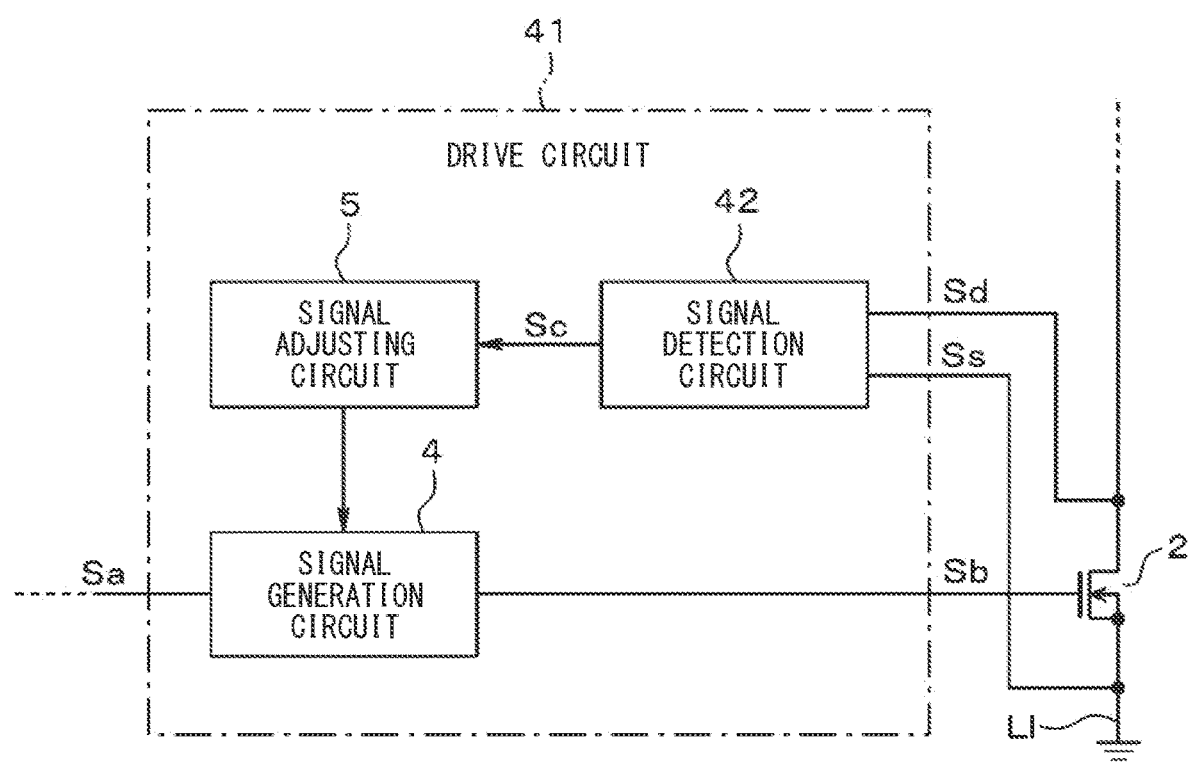
FIG. 8 is a diagram schematically showing a configuration of a drive circuit according to a fourth embodiment.

The following will describe a third embodiment of the present disclosure with reference to FIG. 6 and FIG. 7. In the third embodiment, a configuration of the signal detection circuit is changed from the first embodiment.

As shown in FIG. 6, a signal detection circuit 31 of the present embodiment includes a signal generation unit 32 instead of the signal generation unit 6 included in the signal detection circuit 3 of the first embodiment shown in FIG. 2. The signal detection circuit 31 of the present embodiment includes a capacitor C4 instead of the capacitor C2 according to the first embodiment. The signal generation unit 32 has the same configuration as the signal generation unit 6. The output terminal of the buffer 9, which corresponds to the output terminal of the signal generation unit 32, is connected to the other input terminal of the comparator 7 via the capacitor C4.

In the present embodiment, the capacitor C4 corresponds to a second capacitor, and one terminal is connected to the output terminal of the signal generation unit 32. The other terminal of the capacitor C4 is connected to one input terminal of the comparator 7. As described above, in the signal detection circuit 31 of the present embodiment, the signal of the other terminal of the capacitor C1 is input to one input terminal of the comparator 7, and the signal of the other terminal of the capacitor C2 is input to the other input terminal of the comparator 7.

The detection operation executed by the signal detection circuit 31 having the above-described configuration will be described with reference to FIG. 7. In the present embodiment, turn-on and turn-off control of the switches SW1 to SW3 is the same as that of the first embodiment. The switches SW1 and SW3 are in turn-on states during the period Ta. Thus, the potential of the power supply line L3 (for example, 0 Volt) is applied to both of two input terminals of the comparator 7. Thus, the input signals I+ and I− are 0 Volt. In the present embodiment, for example, the reference voltage Vref generated by the DAC 8 may be set to 2 Volts.

When the period Ta ends and the period Tb starts, the voltage division signal generated by dividing the signal Sd is applied to one input terminal of the comparator 7 via the capacitor C1. At this time, the reference voltage Vref generated by the DAC 8 is applied to the other terminal of the capacitor C4 via the switch SW2 and the buffer 9. During the period Tb, the reference voltage Vref is applied to the other input terminal of the comparator 7 via the capacitor C4.

The value of the reference voltage Vref is set so that the input signal I+ and the input signal I− intersect with one another at a time when the voltage VDS reaches the reference voltage Vref. The detection signal Sc output from the signal detection circuit 31 of the present embodiment is a binary signal that inverts in response to the voltage VDS reaching the reference voltage Vref, similarly to the detection signal Sc output from the signal detection circuit 3 of the first embodiment.

The present embodiment also provides the same effects as those of the first embodiment. In the present embodiment, the signal Sd is input to one input terminal of the comparator 7, and the reference voltage Vref is input to the other input terminal of the comparator 7. That is, the signal Sd and the reference voltage Vref are separately input to the comparator 7 from one another.

The signal Sd is a signal of the drain of the switching element 2. Thus, the signal Sd may change sharply during the switching operation of the switching element 2. In the first embodiment, the signal Sd and the reference voltage Vref are input to the same input terminal of the comparator 7. In this configuration, it is necessary to use an element capable of executing a high-speed operation as the buffer 9 of the signal generation unit 6 so that a change of the reference voltage Vref affected by fluctuation of the signal Sd can be avoided.

In the present embodiment, the signal Sd and the reference voltage Vref are input to different input terminals of the comparator 7. Thus, the reference voltage Vref is not affected by the fluctuation of the signal Sd. Therefore, it is not necessary to use an element capable of executing a high-speed operation as the buffer 9 of the signal generation unit 32. That is, it is possible to use an element having a relatively low-speed operation as the buffer 9. As described above, in the present embodiment, a capability, such as the operating speed required for the buffer 9 can be lowered. Thus, a circuit size of the signal generation unit 32 of the present embodiment can be decreased compared with a circuit size of the signal generation unit 6 of the first embodiment. Therefore, according to the present embodiment, it is possible to further suppress an increase in circuit size compared with the first embodiment.

Fourth Embodiment

The following will describe a fourth embodiment of the present disclosure with reference to FIG. 8 to FIG. 16

(General Configuration)

In the present embodiment, a drive circuit 41 is different from the drive circuit 1 of the first embodiment. Specifically, the drive circuit 41 of the present embodiment includes a signal detection circuit 42 instead of the signal detection circuit 3 of the first embodiment. The signals of the main terminals of the switching element 2, that is, the signal Ss of the source of the switching element 2 and the signal Sd of the drain of the switching element 2 are input to the signal detection circuit 42.

Therefore, the signals Ss and Sd correspond to detection target signals to be detected by the signal detection circuit 42. In the present embodiment, the detection target signal is the voltage VDS between the drain and the source of the switching element 2, and the detection signal Sc output from the signal detection circuit 42 is a binary signal that inverts in response to the voltage VDS reaching the reference voltage Vref.

(Configuration of Signal Detection Circuit)

Figure 9:
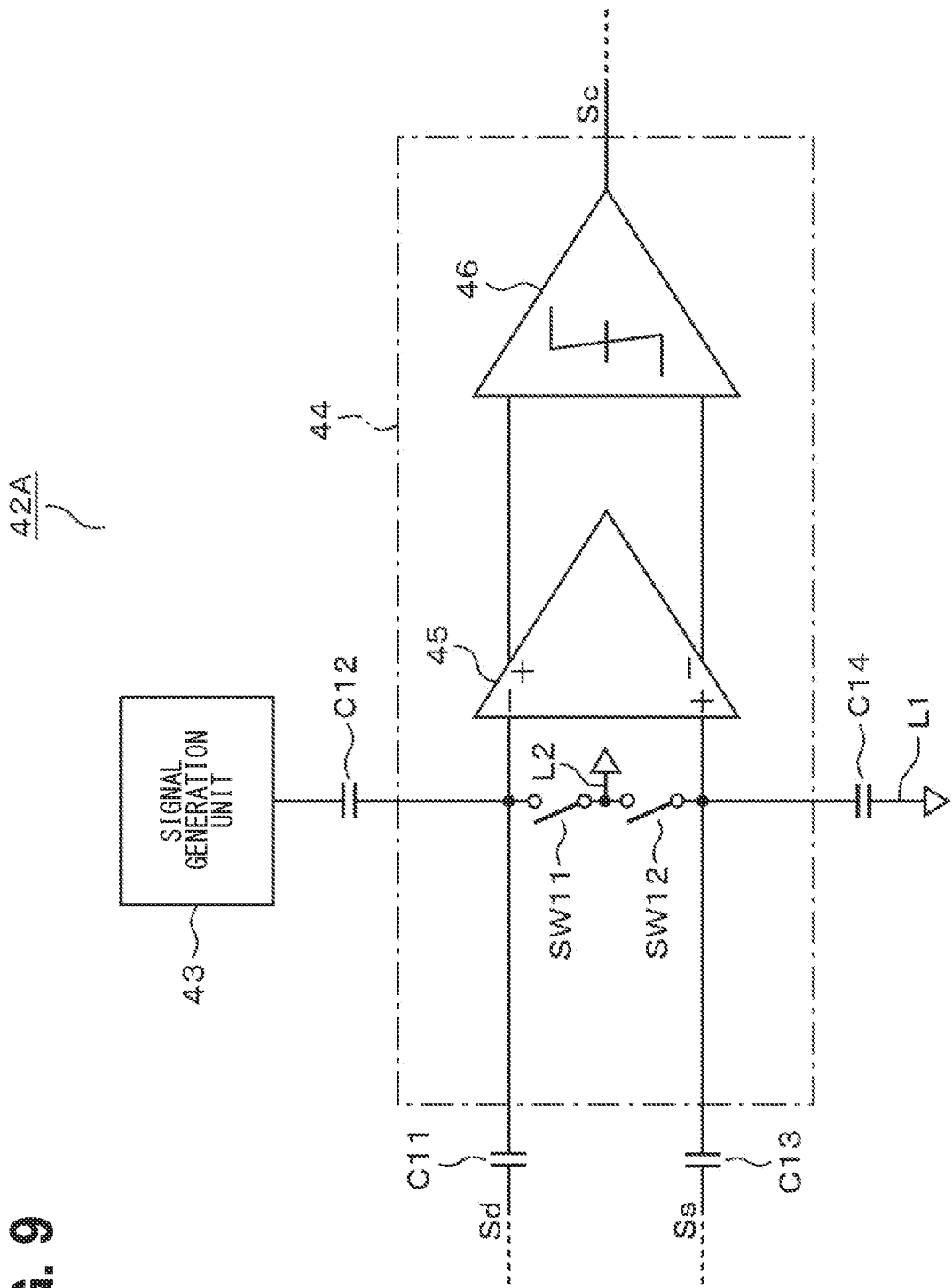
FIG. 9 is a diagram schematically showing a first configuration example of a signal detection circuit according to the fourth embodiment.
Figure 10:
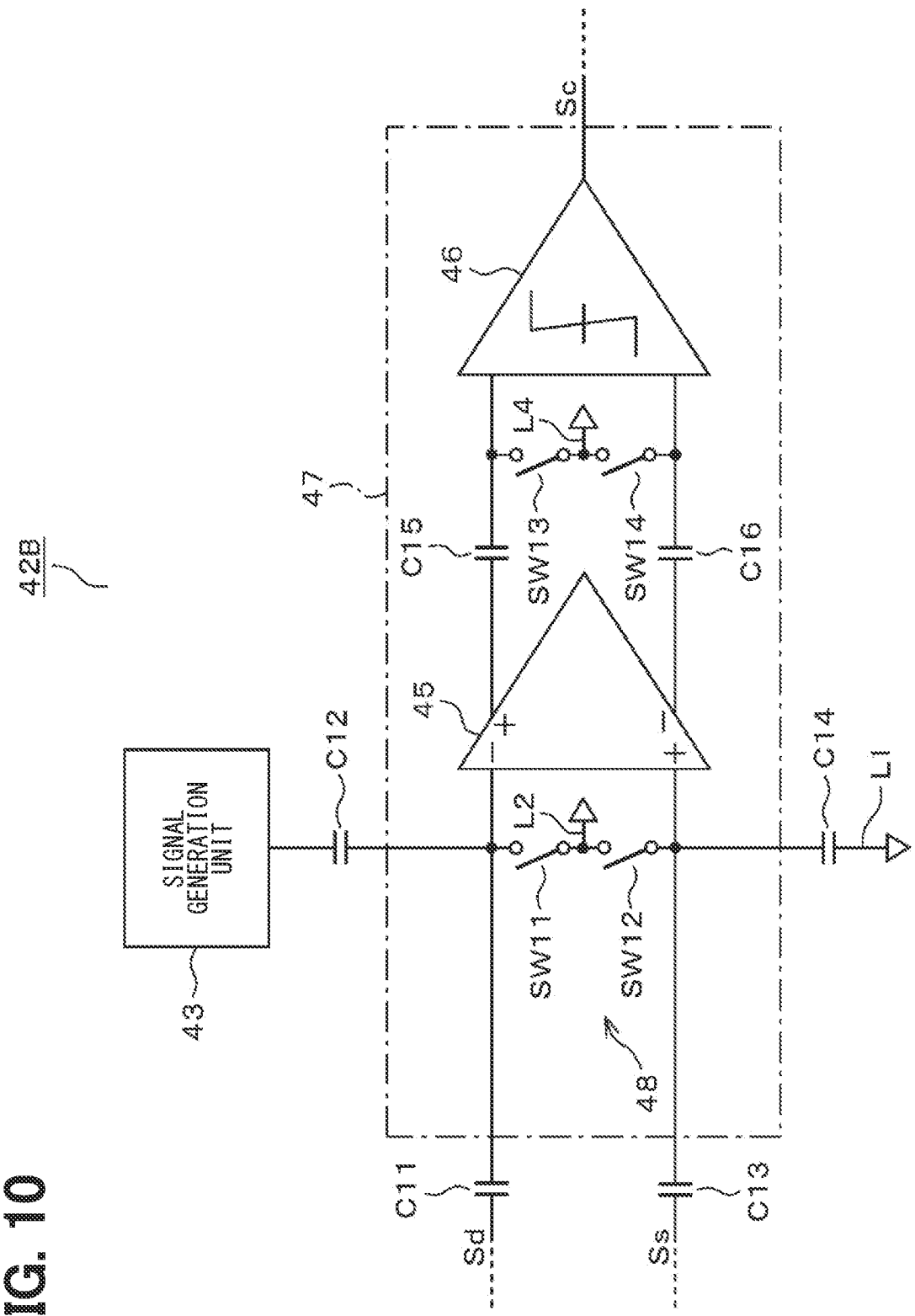
FIG. 10 is a diagram schematically showing a second configuration example of a signal detection circuit according to the fourth embodiment.

For example, the signal detection circuit 42 may have a first configuration example as shown in FIG. 9 or a second configuration example as shown in FIG. 10. As shown in FIG. 9, a signal detection circuit 42A of the first configuration example includes a signal generation unit 43, capacitors C11 to C14, and a detection circuit 44. Although not shown, the signal generation unit 43 may have the same configuration as the signal generation unit 22 described in the second embodiment. That is, the signal generation unit 43 may include a DAC 8 and two switches SW2 and SW3 as the signal generation unit 22 of the second embodiment. Alternatively, the signal generation unit 43 may have the same configuration as the signal generation unit 6 described in the first embodiment. That is, the signal generation unit 43 may include a DAC 8, a buffer 9, and two switches SW2 and SW3 as the signal generation unit 6 of the first embodiment.

The capacitor C11 corresponds to a first capacitor, and one terminal of the first capacitor C1 is connected to the drain of the switching element 2. The capacitor C12 corresponds to a second capacitor, and one terminal is connected to the output terminal of the signal generation unit 43. The other terminal of the capacitor C11 and the other terminal of the capacitor C12 are connected to the detection circuit 44. In the above configuration, the capacitors C11 and C12 configure a voltage dividing circuit that divides the signal Sd, specifically, the drain voltage of the switching element 2.

The capacitor C13 corresponds to a third capacitor, and one terminal of the third capacitor C13 is connected to the source of the switching element 2. The capacitor C14 corresponds to a fourth capacitor, and one terminal of the fourth capacitor is connected to the power supply line L1. The potential of the power supply line L1 (for example, 0 Volts) corresponds to the reference potential. The other terminal of the capacitor C13 and the other terminal of the capacitor C14 are connected to the detection circuit 44. The capacitors C13 and C14 configure a voltage dividing circuit that divides the signal Ss, specifically, the source voltage of the switching element 2.

One terminal of the first capacitor C11 is connected to the drain of the switching element 2 without a switch that can open or close the line between the first capacitor C11 and the drain of the switching element. One terminal of the third capacitor C13 is connected to the source of the switching element 2 without a switch that can open or close the line between the third capacitor C13 and the source of the switching element. The detection circuit 44 receives, as input signals, the signals from other terminals of the capacitors C11, C12, C13 and C14, and detects the detection target signal based on the input signals.

The detection circuit 44 has a differential configuration, and includes switches SW11, SW12, a differential amplifier 45, and a comparator 46. The differential amplifier 45 is a fully differential amplifier. The other terminal of the capacitor C11 and the other terminal of the capacitor C12 are connected to an inverting input terminal of the differential amplifier 45, and the other terminal of the capacitor C13 and the other terminal of the capacitor C14 are connected to a non-inverting input terminal of the differential amplifier 45. The inverting input terminal of the differential amplifier 45 is connected to the power supply line L2 via the switch SW11, and the non-inverting input terminal of the differential amplifier 45 is connected to the power supply line L2 via the switch SW12.

In the above configuration, the inverting input terminal and the non-inverting input terminal of the differential amplifier 45 correspond to the two input terminals of the detection circuit 44. In the above configuration, the differential amplifier 45 functions as an amplifier that receives, as inputs signals, the signal from the other terminal of the capacitor C11 and the signal from the other terminal of the capacitor C13, and outputs a signal obtained by amplifying the input signals. In the present disclosure, amplifying indicates amplifying by an amplification factor of 1 or greater, and also indicates amplifying by an amplification factor of less than 1, that is, attenuation.

The non-inverting output terminal of the differential amplifier 45 is connected to one input terminal of the comparator 46. The inverting output terminal of the differential amplifier 45 is connected to the other input terminal of the comparator 46. The comparator 46 functions as a comparator to which the output signals of the differential amplifier 45 are input. In the above configuration, a signal output from the output terminal of the comparator 46 corresponds to the detection signal Sc described above.

As shown in FIG. 10, a signal detection circuit 42B having the second configuration example is different from the signal detection circuit 42A having the first configuration example in that a detection circuit 47 is provided instead of the detection circuit 44. The detection circuit 47 includes switches SW13, SW14 and capacitors C15 and C16 in addition to the components of the detection circuit 44. In the second configuration example, the switches SW11 and SW12 function as an identical signal input unit 48 that inputs the identical signal to each input terminal of the differential amplifier 45.

One terminal of the capacitor C15 is connected to the non-inverting output terminal of the differential amplifier 45, and the other terminal of the capacitor C5 is connected to one input terminal of the comparator 46. One terminal of the capacitor C16 is connected to the inverting output terminal of the differential amplifier 45, and the other terminal of the capacitor C16 is connected to the other input terminal of the comparator 46. Each of the capacitors C15 and C16 functions as a storage capacitor by connecting one terminal with the output terminal of the differential amplifier 45 and connecting the other terminal with the input terminal of the comparator 46. The other terminal of the capacitor C15 is connected, via a switch SW13, to a power supply line L4 to which a predetermined reference potential (for example, 0 Volts) is applied. The other terminal of the capacitor C16 is connected to the power supply line L4 via the switch SW14.

The following will describe an operation of the above configuration.

(Detection Operation According to the First Configuration Example)

Figure 11:
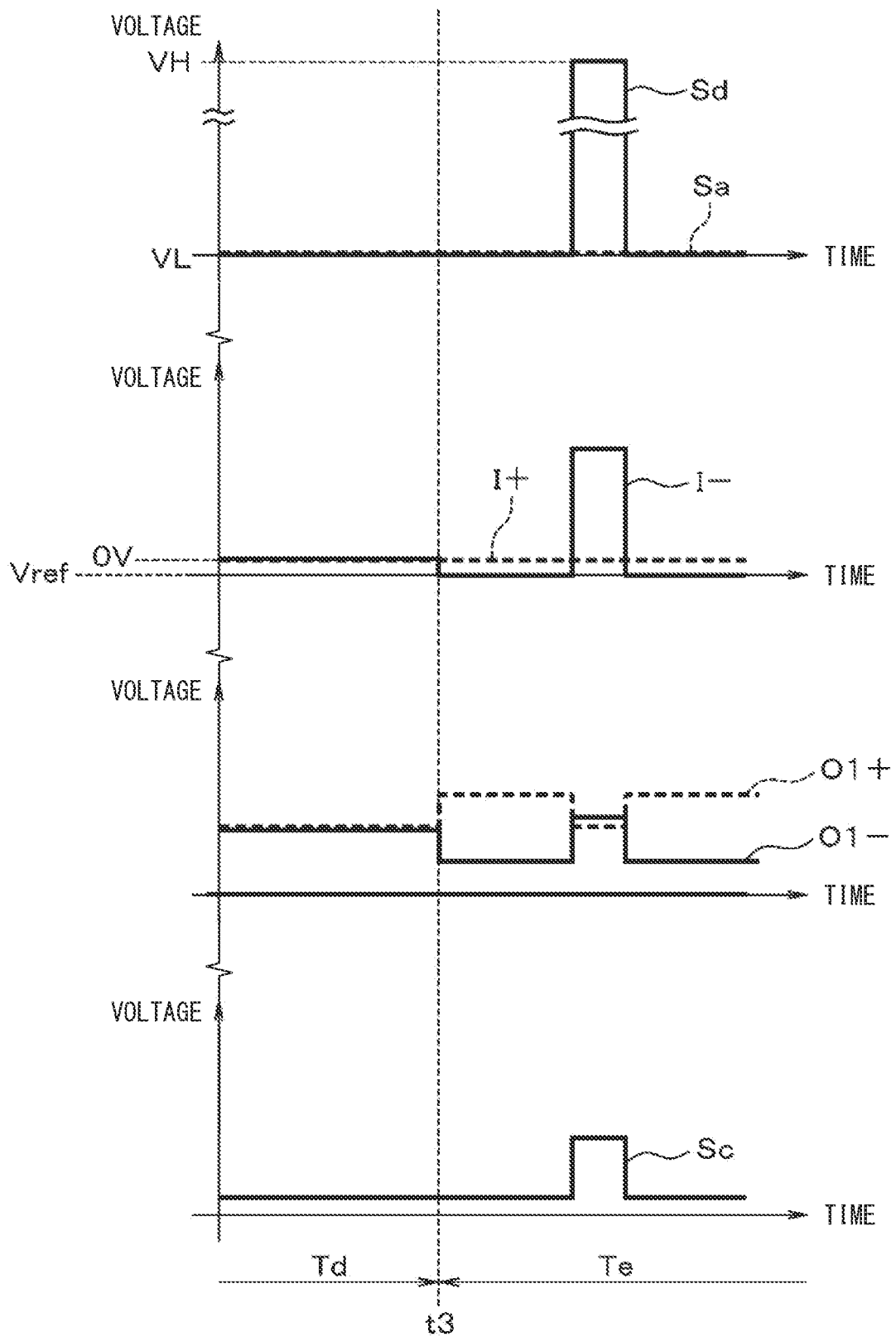
FIG. 11 is a diagram showing time charts of signals at respective points during execution of a detection operation according to the fourth embodiment.

The detection operation executed by the signal detection circuit 42A of the first configuration example will be described with reference to FIG. 11. The input signal on the inverting input terminal of the differential amplifier 45 is I1−, the input signal on the non-inverting input terminal of the differential amplifier 45 is I1+, the output signal on the non-inverting output terminal of the differential amplifier 45 is O1+, and the output signal on the inverting output terminal of the differential amplifier 45 is O1−.

During the detection operation of the signal detection circuit 42A, the switches SW11 and SW12 are controlled to turn on and turn off as follows. In the turn-on state of the switching element 2, during a period Td up to a time point t3, the switches SW11 and SW12 are set to turn-on states. In the turn-on state of the switching element 2, during a period Te after the time point t3, the switches SW11 and SW12 are set to turn-off states.

The signal Ss corresponding to the source voltage of the switching element 2 has the voltage VL (for example, 0 Volts) of the DC power supply line LI throughout an entire operation period of the switching element 2. The signal Sd corresponding to the drain voltage of the switching element 2 has the voltage VL during the turn-on state of the switching element 2, and has the voltage VH (for example, several hundreds of volts) of the direct current power supply line on the high potential side during the turn-off state of the switching element 2. The signals Sd and Ss are input to the differential amplifier 45 via the capacitors C11 and C13, respectively.

During the period Td, the inverting input terminal of the differential amplifier 45 is connected to the power supply line L2 via the switch SW11, and the non-inverting input terminal of the differential amplifier 45 is connected to the power supply line L2 via the switch SW12. Thus, both of the input signals I+ and I− of the differential amplifier 45 are 0 Volts. When the period Td ends and the period Te starts, the switches SW11 and SW12 are switched from turn-on states to turn-off states. Therefore, during the period Te, the signal Sd is applied to the inverting input terminal of the differential amplifier 45 via the capacitor C11, and the reference voltage Vref (for example, −2 Volts) is also applied to the inverting input terminal of the differential amplifier 45 via the capacitor C12.

The input signal I− of the differential amplifier 45 is obtained by adding the value of the reference voltage Vref (for example, −2 Volts) to the value of the division voltage signal obtained by dividing the signal Sd. That is, a voltage value obtained by assigning an offset corresponding to the reference voltage Vref to the voltage division signal is input to the differential amplifier 45 as the input signal I−. During the period Te, the signal Ss is applied to the non-inverting input terminal of the differential amplifier 45 via the capacitor C13, and the potential of the power supply line L1 (for example, 0 Volts) is also applied to the non-inverting input terminal of the differential amplifier 45 via the capacitor C14. Thus, the input signal I+ maintains 0 Volts throughout the periods Td and Te.

As described above, during the period Te, a signal obtained by dividing the signal Sd and the signal Ss are input to respective input terminals of the differential amplifier 45. That is, in the present embodiment, the drain voltage and the source voltage of the switching element 2 are decreased, and then the decreased voltages are input to the differential amplifier 45. Thus, as circuit components, low withstand voltage elements having relatively low withstand voltages can be used in a stage of the circuit subsequent to the voltage dividing circuits.

When the above-described signals are input to the differential amplifier 45, the differential amplifier 45 outputs signals O1+ and O1− which are signals representing a difference between the signal Sd and the signal Ss. The output signals O1+ and O1− are differential signals having phases opposite to one another. The voltage amplitudes of the output signals O1+ and O1− correspond to the power supply voltage supplied to the differential amplifier 45. The value of the reference voltage Vref is set so that the output signal O1+ and the output signal O1− intersect with one another at a time when the voltage VDS reaches the reference voltage Vref.

The comparator 46 is configured to output a binary signal having a high level during a period in which the voltage of the other input terminal is higher than the voltage of one input terminal. Therefore, the detection signal Sc output from the comparator 46 has a low level when the voltage VDS is lower than the reference voltage Vref, and the detection signal Sc has a high level when the voltage VDS is equal to or higher than the reference voltage Vref. That is, the detection signal Sc is a binary signal, and the level of detection signal Sc inverts in response to the voltage VDS reaching the reference voltage Vref. The low level and high level of the detection signal Sc are voltage values corresponding to the power supply voltage supplied to the comparator 46.

(Detection Operation According to the Second Configuration Example)

The detection operation with reset function performed by the signal detection circuit 42B of the second configuration example will be described with reference to FIG. 12 to FIG. 16. The reset function is able to cancel the output offset of the differential amplifier 45. The detection operation with the reset function includes a first step, a second step, and a third step executed in the described order. In the first step, the switches SW11 and SW12 are set to turn-on states, and the switches SW13 and SW14 are set to turn-off states. In the second step, the switches SW11 to SW14. In the third step, the switches SW11 to SW14 are set to turn-off states.

Figure 12:
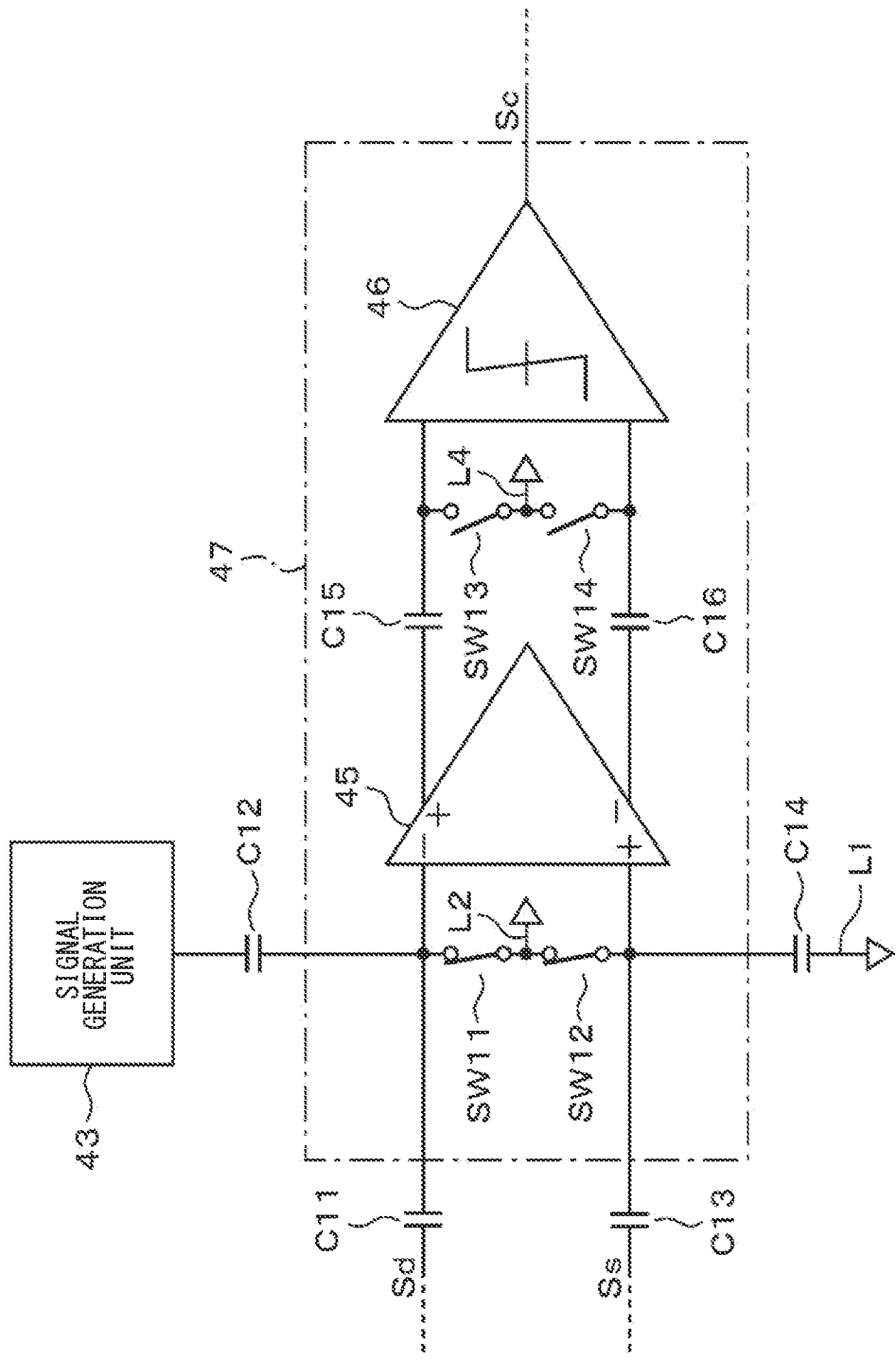
FIG. 12 is a diagram showing an on/off state of a switch during execution of a first step of a detection operation with a reset function according to the fourth embodiment.

In the first step, as shown in FIG. 12, the switches SW11 and SW12 are set to turn-on states and the switches SW13 and SW14 are set to turn-off states. As a result, the two input terminals of the differential amplifier 45 are short-circuited. As shown in FIG. 13A to FIG. 14B, the input signal I1+ applied to the non-inverting input terminal of the differential amplifier 45 and the input signal I1− applied to the inverting input terminal of the differential amplifier 45 have the same signal levels regardless of the signals Sd and Ss. That is, the same signals are input to the input terminals of the differential amplifier 45 in the first step.

Figure 13A:
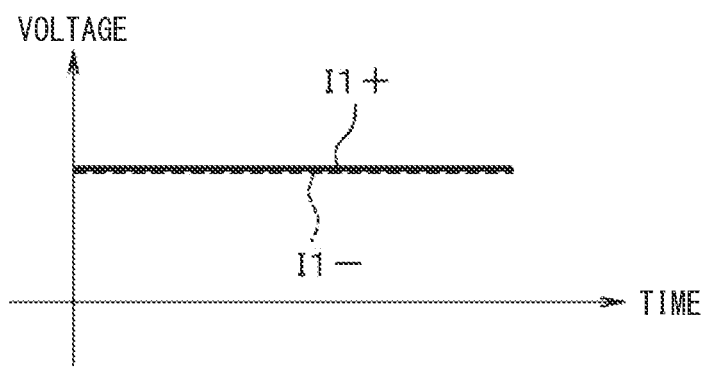
FIG. 13A and FIG. 13B are time charts each schematically showing a signal at a point during execution of a first step of the detection operation with the reset function according to the fourth embodiment.
Figure 13B:
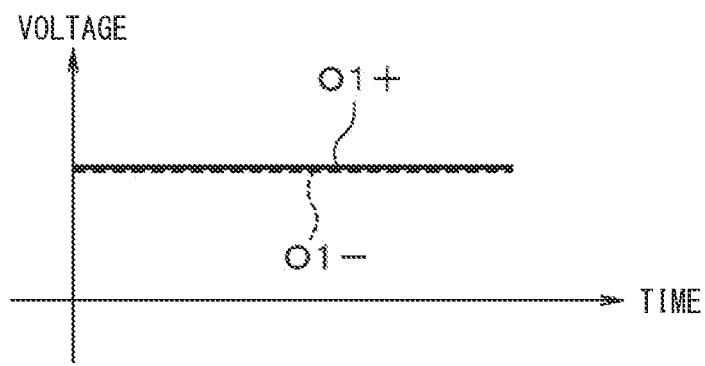
Figure 14A:
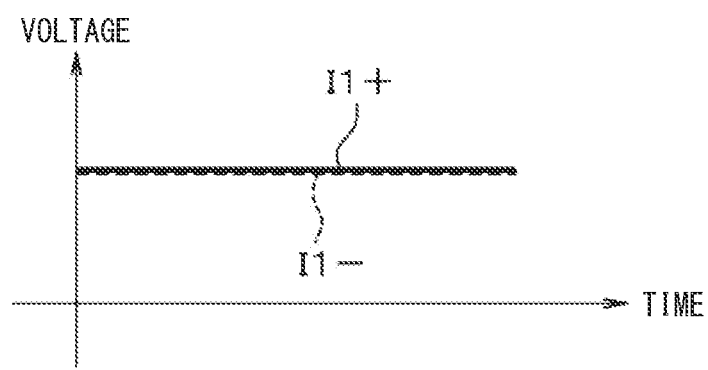
FIG. 14A and FIG. 14B are time charts each schematically showing a signal at a point during execution of the first step of the detection operation with the reset function according to the fourth embodiment.
Figure 14B:
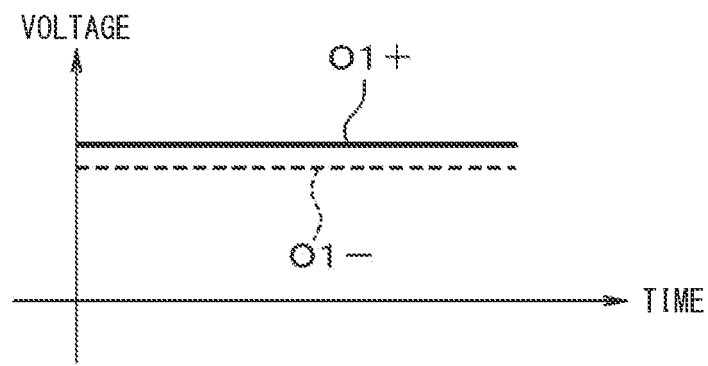

The output signals O1+ and O1− output from the differential amplifier 45 correspond to offset of the differential amplifier 45. The offset referred to here is caused by a characteristic error of each element constituting the differential amplifier 45, and the offset may cause an output error. When there is no offset in the differential amplifier 45, as shown in FIG. 13B, the output signals O1+ and O1− have the same levels, that is, the same voltage values. When there exists an offset in the differential amplifier 45, as shown in FIG. 14B, the output signals O1+ and O1− have different levels from one another, and the difference between the two output signals corresponds to the above-described offset.

Figure 15:
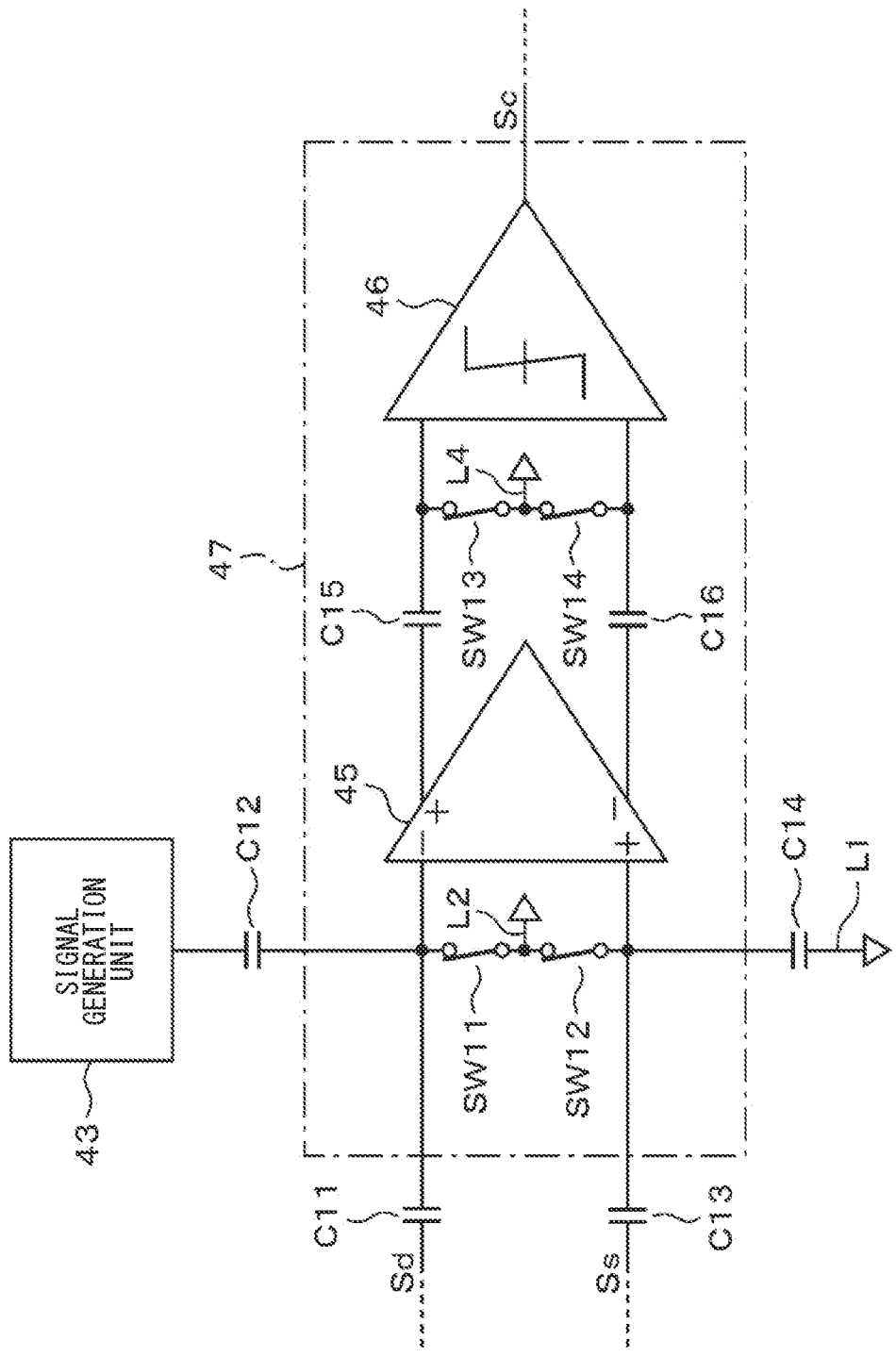
FIG. 15 is a diagram showing an on/off state of a switch during execution of a second step of the detection operation with a reset function according to the fourth embodiment.

In the second step, as shown in FIG. 15, the operation states of switches SW13 and SW14 change from off states to on states. As a result, electric charge corresponding to the respective voltages of the output signals O1+ and O1−, which are voltages with the potential of the power supply line L4 (for example, 0 Volts) as the reference, are injected into the capacitors C15 and C16. The amount of electric charge injected into the capacitor C15 is nearly the same as the amount of electric charge injected into the capacitor C16 when there is no offset in the differential amplifier 45. When the offset exists in the differential amplifier 45, the amount of electric charge injected into the capacitor C15 is different from the amount of electric charge injected into the capacitor C16, and the difference therebetween corresponds to the offset.

In the subsequent third step, as shown in FIG. 10, all of the switches SW11 to SW14 are set to turn-off states, and the same operation as the detection operation according to the first configuration example described above is performed. In the third step of the second configuration example, the amount of electric charge injected into the capacitor C15 is different from the amount of electric charge injected to the capacitor C16, and the difference corresponds to the offset of the differential amplifier 45. The output signals O1+ and O1− of the differential amplifier 45 are applied to the comparator 46 via the capacitors C15 and C16. As a result, a zero point correction is carried out to the outputs of the differential amplifier 45 by the capacitors C15 and C16, and the voltages in which the offset of the differential amplifier 45 are canceled are input to respective input terminals of the comparator 46.

Figure 16:
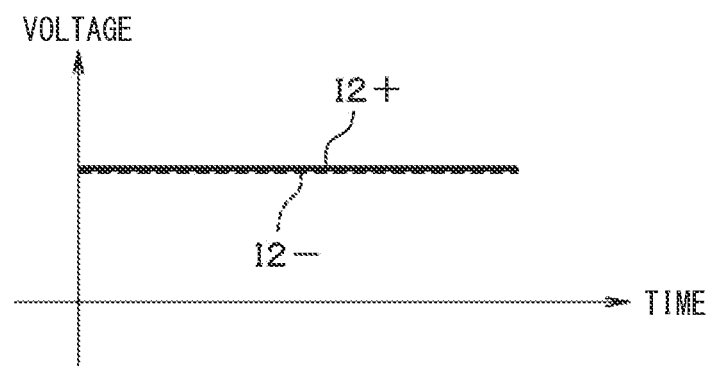
FIG. 16 is a time chart schematically showing a signal at a point during execution of a third step of the detection operation with the reset function according to the fourth embodiment.

Therefore, regardless of whether there is no offset or there is an offset in the differential amplifier 45, under a condition that the input signals applied to the two input terminals of the differential amplifier 45 have the same levels, as shown in FIG. 16, the input signal I2+ applied to one input terminal of the comparator 46 and the input signal I2− applied to the other input terminal of the comparator 46 have the same level, that is, the same voltage value. As described above, the reset function is provided in the signal detection circuit 42B. Specifically, the offset amounts of the differential amplifier 45 are stored in the capacitors C15 and C16 in the second step. In the third step, the detection operation is performed via the capacitors C15, C16 in which the offset amounts are stored. Thus, the adverse effect caused by the offsets of the differential amplifier 45 on the signal detection result can be eliminated.

As described above, in the signal detection circuits 42A and 42B of the present embodiment, the signal Sd of the drain of the switching element 2 and the reference voltage Vref are input to the differential amplifier 45 of the detection circuit 44, 47 via the capacitors C11 and C12. At the same time, the signal Ss of the source of the switching element 2 and the reference potential are input to the differential amplifier 45 of the detection circuit 44, 47 via the capacitors C13 and C14. Therefore, each input signal input to the detection circuit 44, 47 is affected by the parasitic capacitance existing at the input terminal of the differential amplifier 45 at the same level. Therefore, according to the present embodiment, the influence of the parasitic capacitance on the detection accuracy of the detection target signal can be suppressed similar to the first embodiment of the present disclosure.

Further, in the present embodiment, the detection circuit 44, 47 has a differential configuration in which the detection target signal is detected based on each input signal. According to the above configuration, the drain signal Sd and the source signal Ss of the switching element 2 are input to the detection circuit 44, 47 in differential manner. Thus, in a case where the capacitances of the capacitors C11 and C12 disposed on the input side are relatively small, the adverse effect of the parasitic capacitance on the detection accuracy of the detection target signal can be further suppressed.

The signal detection circuit 42B is configured to have the reset function that cancels the output offset of the differential amplifier 45. With this configuration, the adverse effect of the offset caused by the characteristic error of elements configuring the differential amplifier 45 on the signal detection result can be suppressed. Therefore, according to the present embodiment, the signal detection accuracy can be further improved.

In the signal detection circuit 42A, 42B, one terminal of the capacitor C11 is directly connected to the drain of the switching element 2 without an electrically openable/closable switch, and one terminal of the capacitor C13 is directly connected to the source of the switching element 2 without an electrically openable/closable switch. That is, in the above configuration, no switch is provided in front stage of the signal input. With such a configuration, the following effects can be obtained. In the conventional signal detection circuit (hereinafter referred to as a comparative example) which includes a switched capacitor circuit and amplifiers, a switch is usually provided in front stage of the signal input.

This is because the switching operation that switches on state and off state of the switch (hereinafter also referred to as alternative current (AC) operation) generates AC waveform and applies the generated AC waveform to the capacitor included in the switched capacitor circuit. In such a comparative example, when the voltage of detection target signal is relatively high as described in the present embodiment, it is necessary to use a high withstand voltage element as the switch element provided in front stage of the signal input. In a case where the high withstand voltage element is provided, as the switch element, in front stage of the signal input, decrease in response speed and increase in circuit size may occur in the comparative example.

In the present embodiment, a transient waveform, that is, the AC waveform is applied to the signal detection circuit 42A, 42B on the input side. Thus, the input voltage can be applied to the capacitor without providing a switch in front stage of the signal input side different from the comparative example in which the switch is provided in front stage of the signal input side. According to the configuration of the present embodiment, since the switch is not provided in front stage of the signal input side, it is possible to prevent the influence of the leak current and malfunction such as oscillation that are caused by the switch. Further, according to the configuration of the present embodiment, it is possible to prevent attenuation of high speed signal and the circuit size can be decreased to a compact size.

Fifth Embodiment

Figure 17:
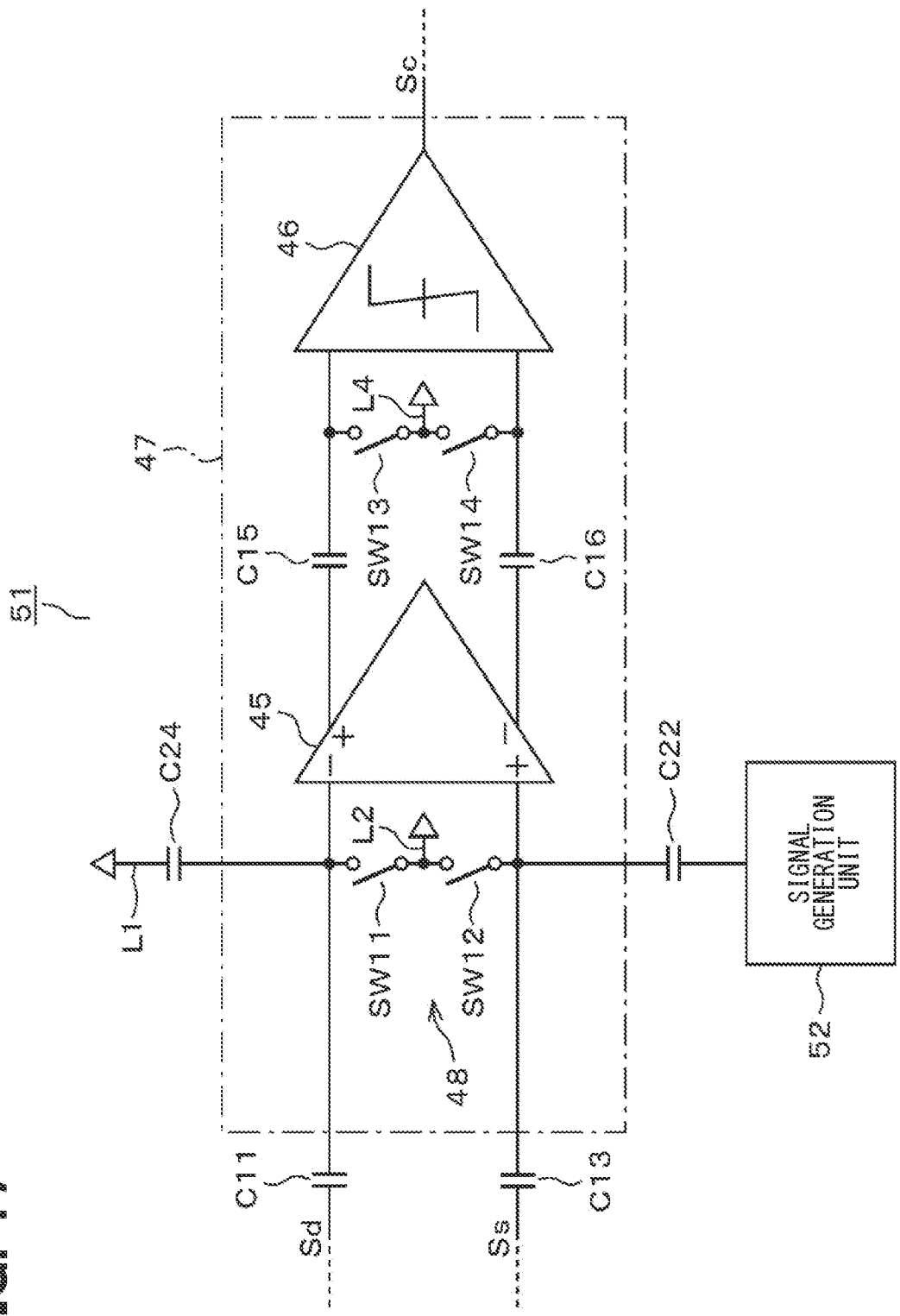
FIG. 17 is a diagram schematically showing an exemplary configuration of a signal detection circuit according to a fifth embodiment.

The following will describe a sixth embodiment of the present disclosure with reference to FIG. 17. In the fifth embodiment, a configuration of the signal detection circuit is changed from the second configuration example of the fourth embodiment. Similar change can also be made with respect to the first configuration example of the fourth embodiment.

As shown in FIG. 17, a signal detection circuit 51 of the present embodiment includes a signal generation unit 52 instead of the signal generation unit 43 included in the signal detection circuit 42B of the fourth embodiment shown in FIG. 10. The signal detection circuit 51 of the present embodiment includes capacitors C22, C24 instead of the capacitors C12, C14 of the fourth embodiment. The capacitor C22 functions as a second capacitor, and the capacitor C24 functions as a fourth capacitor. The signal generation unit 52 has the same configuration as the signal generation unit 43, but its output terminal is connected to the non-inverting input terminal of the differential amplifier 45 via the capacitor C22.

The inverting input terminal of the differential amplifier 45 is connected to the power supply line L1 via the capacitor C24. In the present embodiment, the inverting input terminal of the differential amplifier 45 corresponds to one input terminal of the detection circuit 47, and the non-inverting input terminal of the differential amplifier 45 corresponds to the other input terminal of the detection circuit 47. In the present embodiment, the signal of the other terminal of the capacitor C11 and the signal of the other terminal of the capacitor C24 are input to one input terminal of the detection circuit 47, and the signal of the other terminal of the capacitor C13 and the signal of the other terminal of the capacitor C22 are input to the other input terminal of the detection circuit 47.

In the present embodiment, a detection operation similar to that of the fourth embodiment can be executed. Thus, similar effect to that of the fourth embodiment can be provided. Further, according to the present embodiment, the following effects can be achieved. The signal Ss corresponding to the source voltage of the switching element 2 has a constant value, that is, the voltage of the DC power supply line LI (for example, 0 Volts) regardless of the operating state of the switching element 2. The signal Sd of the drain voltage of the switching element 2 changes according to the operation state (on/off state) of the switching element 2. Specifically, the signal Sd of the drain voltage of the switching element becomes the voltage of the DC power supply line LI during the turn-on period of the switching element 2, and becomes the voltage of the DC power supply line of the high potential side during the turn-off period of the switching element 2.

The change amount of the signal Ss of the source of the switching element 2 is smaller than the change amount of the signal Sd of the drain of the switching element 2. In the signal detection circuit 51 of the present embodiment, among the two input terminals of the detection circuit 47, the reference voltage Vref generated by the signal generation unit 52 is input to the same input terminal as the input terminal to which the signal Ss of the source of the switching element 2 is input.

According to the above configuration, the reference voltage Vref is not affected by the fluctuation of the signal Sd. Therefore, similar to third embodiment, the operating speed performance required for the circuit elements configuring the signal generation unit 52 can be lowered. Thus, the signal generation unit 52 according to the present embodiment can further decrease the circuit size compared with the signal generation unit 43 of the fourth embodiment. Therefore, according to the present embodiment, it is possible to further suppress an increase in circuit size compared with the fourth embodiment.

Sixth Embodiment

Figure 18:
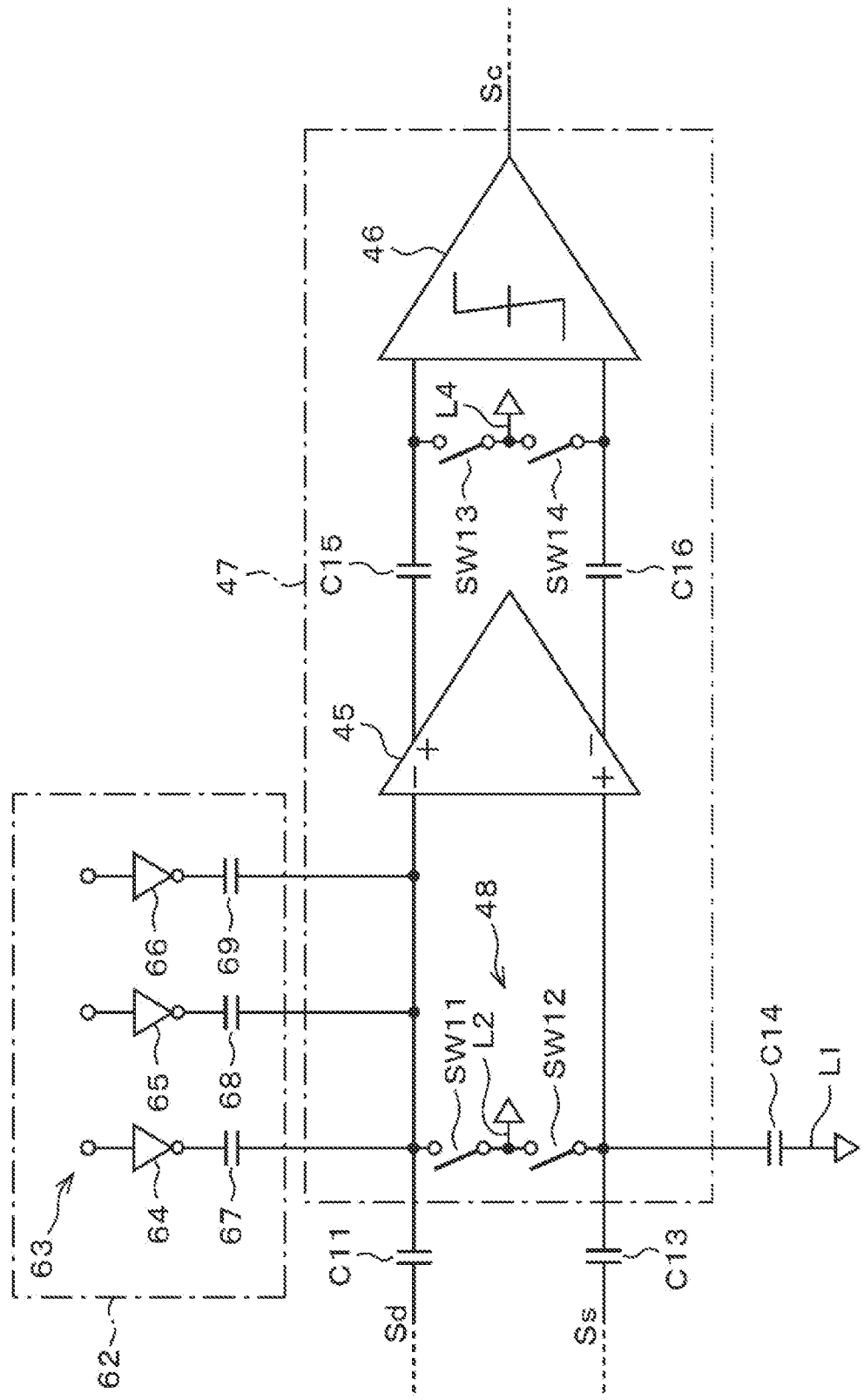
FIG. 18 is a diagram schematically showing an exemplary configuration of a signal detection circuit according to a sixth embodiment.

The following will describe a sixth embodiment of the present disclosure with reference to FIG. 18. In the sixth embodiment, a configuration of the signal detection circuit is changed from the second configuration example of the fourth embodiment. Similar change can also be made with respect to the first configuration example of the fourth embodiment.

As shown in FIG. 18, a signal detection circuit 61 of the present embodiment includes a signal generation unit 62 instead of the signal generation unit 43 included in the signal detection circuit 42B of the fourth embodiment shown in FIG. 10. The signal detection circuit 61 of the present embodiment does not include the capacitor C12 compared with the signal detection circuit 43 of the fourth embodiment. The signal generation unit 62 includes a capacitor array, that is, a digital-to-analog converter (DAC) 63 which is provided by a control digital-to-analog converter (CDAC).

The DAC 63 includes inverters 64, 65, 66 and capacitors 67, 68, 69. The number of inverters and the number of capacitors may be appropriately changed according to the specification required for the DAC 63, and are not limited to the numbers shown in the present embodiment. Signals corresponding to a digital value input to the DAC 63 are applied to input terminals of the inverters 64, 65, 66. The output terminal of each inverter 64, 65, 66 is connected to one terminal of the corresponding capacitor 67, 68, 69. The other terminals of the capacitors 67, 68, 69 are connected to the inverting input terminal of the differential amplifier 45, which corresponds to the input terminal of the detection circuit 47.

In the present embodiment, a detection operation similar to that of the fourth embodiment can be executed. Thus, similar effect to that of the fourth embodiment can be provided. In the signal detection circuit 61 of the present embodiment, the reference voltages Vref generated by the DAC 63 are input to the input terminal of the detection circuit 47 via the capacitors 67, 68, 69 of the DAC 63. In the present embodiment, the function of the second capacitor is provided by the capacitors 67, 68, 69 of the DAC 63. Since the capacitors 67, 68, 69 included in the DAC 63 function as the second capacitor, there is no need to separately provide the second capacitor for inputting the reference voltage Vref to the detection circuit 47.

Therefore, according to the present embodiment, it is possible to further suppress an increase in circuit size compared with the fourth embodiment. According to the configuration which uses, as the signal generation unit 62, the DAC 63 provided by the CDAC, the circuit size can be decreased compared with other configurations. Further, since the voltage value of the reference voltage Vref is digitally determined, the signal detection accuracy can be improved.

(Modification of Sixth Embodiment)

In the present embodiment, the DAC 63 provided by the CDAC configures the signal generation unit 62. As a modification example, the output terminal of the signal generation unit 62 may be configured to input to the non-inverting input terminal of the differential amplifier 45 as the signal generation unit 52 of the fifth embodiment. According to this modification, in addition to the effect obtained by the present embodiment described above, the same effect as that of the fifth embodiment can be obtained.

Seventh Embodiment

Figure 19:
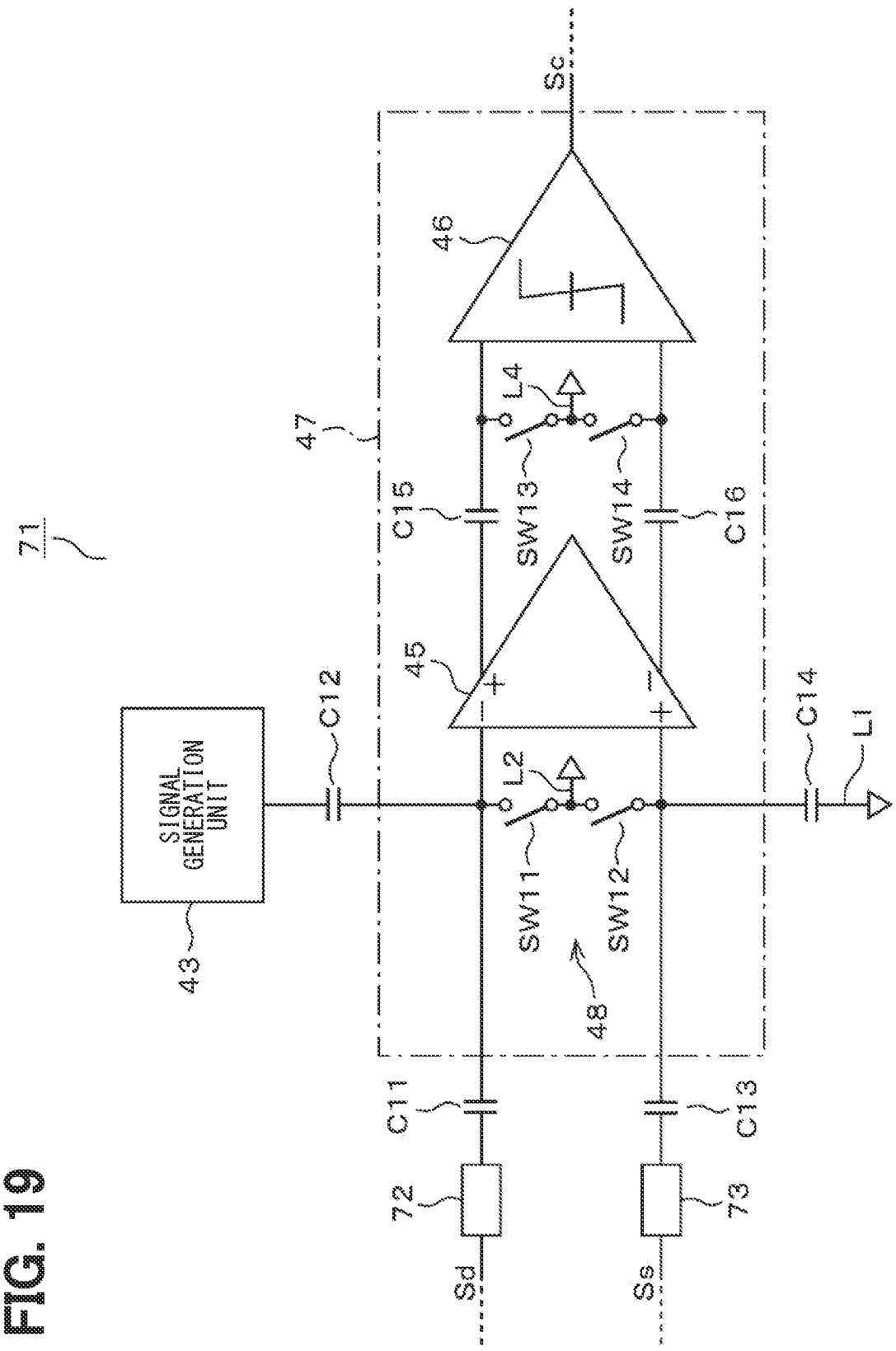
FIG. 19 is a diagram schematically showing an exemplary configuration of a signal detection circuit according to a seventh embodiment.

The following will describe a seventh embodiment of the present disclosure with reference to FIG. 19. In the seventh embodiment, a configuration of the signal detection circuit is changed from the second configuration example of the fourth embodiment. Similar change can also be made with respect to the first configuration example of the fourth embodiment.

As shown in FIG. 19, a signal detection circuit 71 according to the present embodiment is different from the signal detection circuit 42B according to the second configuration example of the fourth embodiment shown in FIG. 10. Specifically, resistors 72 and 73 are added to the signal detection circuit 71 compared with the signal detection circuit 42B.

The resistor 72 is connected between one terminal of the capacitor C11 and the drain of the switching element 2 in series, and corresponds to a first passive element. The resistor 73 is connected between one terminal of the capacitor C13 and the source of the switching element 2 in series, and corresponds to a second passive element. The first passive element and the second passive element are not limited to the resistors 72 and 73, and may be other passive elements such as inductors.

The present embodiment also provides the same effects as those of the fourth embodiment. In the signal detection circuit 71 of the present embodiment, resistors 72 and 73 are provided in the signal input stage. Therefore, influence of static electricity and the like on each element configuring the signal detection circuit 71 can be suppressed. In the present disclosure, static electricity may also be referred to as ESD. According to the present embodiment, it is possible to realize ESD protection that protects each element configuring the signal detection circuit 71 from ESD.

Eighth Embodiment

Figure 20:
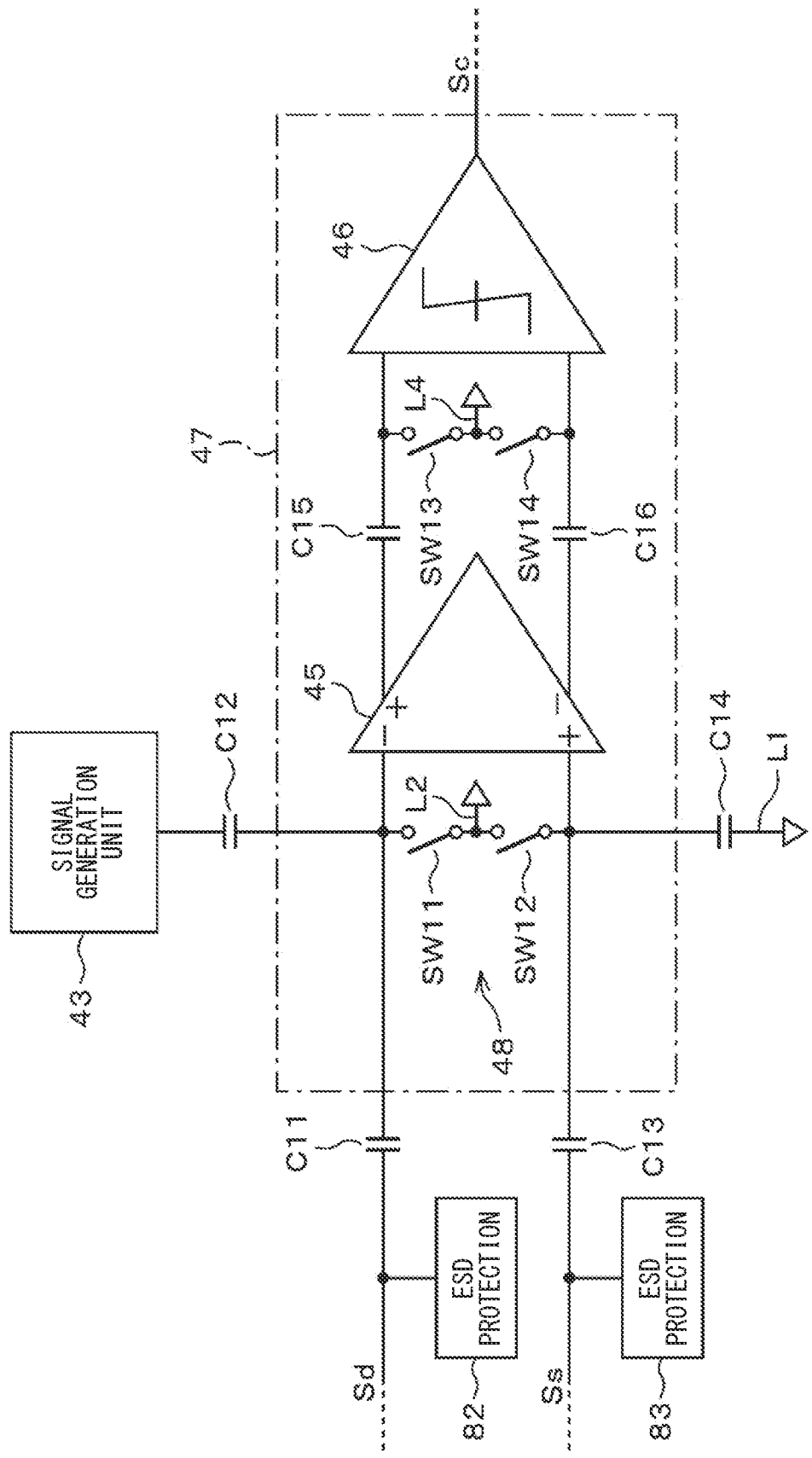
FIG. 20 is a diagram schematically showing an exemplary configuration of a signal detection circuit according to an eighth embodiment.

The following will describe an eighth embodiment of the present disclosure with reference to FIG. 20. In the eighth embodiment, a configuration of the signal detection circuit is changed from the second configuration example of the fourth embodiment. Similar change can also be made with respect to the first configuration example of the fourth embodiment.

As shown in FIG. 20, a signal detection circuit 81 according to the present embodiment is different from the signal detection circuit 42B according to the second configuration example of the fourth embodiment shown in FIG. 10. Specifically, ESD protection elements 82 and 83 are added to the signal detection circuit 81 compared with the signal detection circuit 42B.

The ESD protection element 82 is connected to a path connecting one terminal of the capacitor C11 and the drain of the switching element 2, and corresponds to a first static electricity protection unit. The ESD protection element 83 is connected to a path connecting one terminal of the capacitor C13 and the source of the switching element 2, and corresponds to a second static electricity protection unit. Each ESD protection element 82, 83 includes a diode, or a Zener diode, or a combination of the diode and the Zener diode. The ESD protection element 82, 83 releases the ESD input to the signal detection circuit 81 toward the ground or the like.

The present embodiment also provides the same effects as those of the fourth embodiment. In the signal detection circuit 81 of the present embodiment, the ESD protection elements 82, 83 are provided in the signal input stage. Therefore, influence of static electricity and the like on each element configuring the signal detection circuit 81 can be suppressed. According to the present embodiment, it is possible to realize ESD protection that protects each element configuring the signal detection circuit 81 from ESD.

Ninth Embodiment

Figure 21:
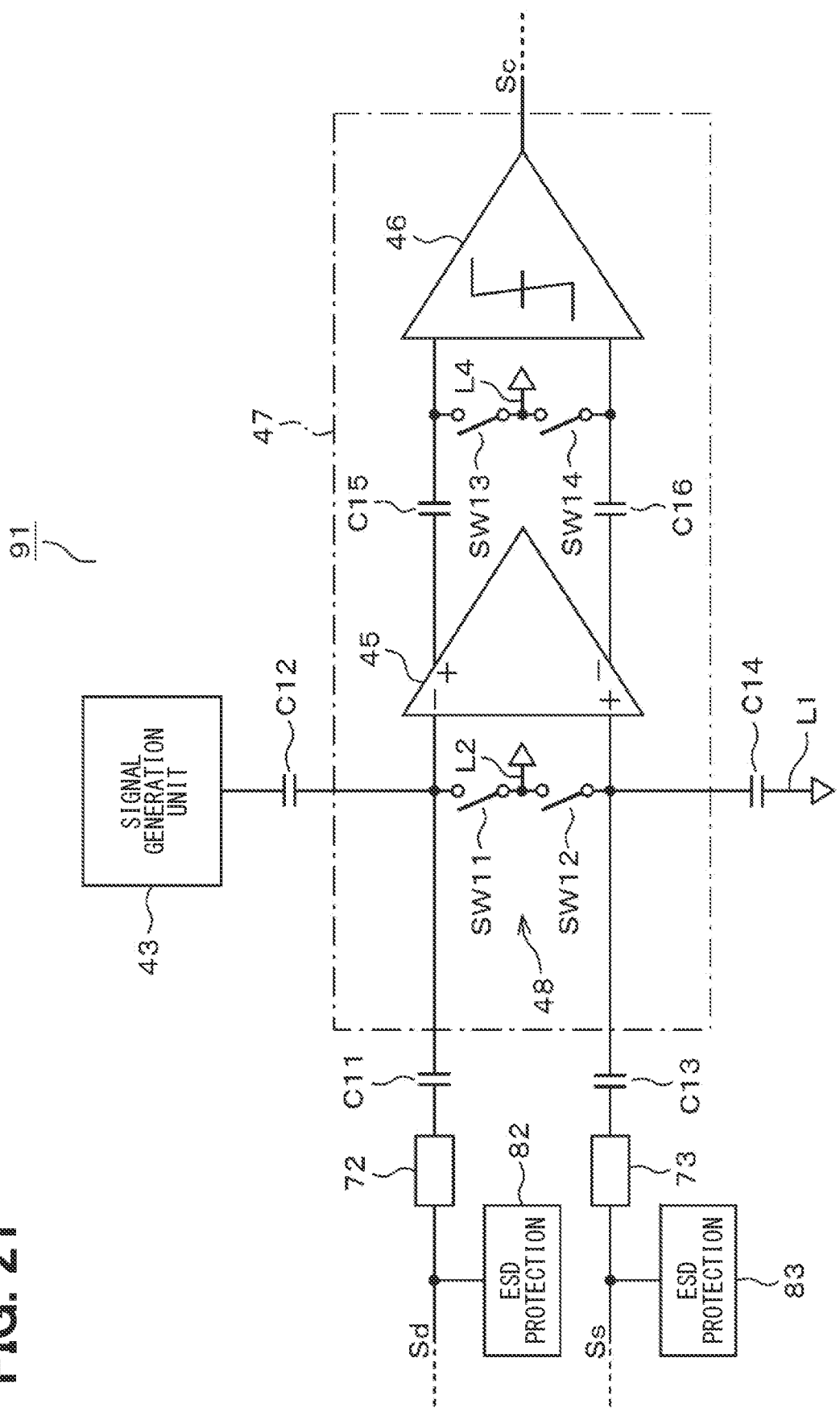
FIG. 21 is a diagram schematically showing a first configuration example of a signal detection circuit according to a ninth embodiment.
Figure 22:
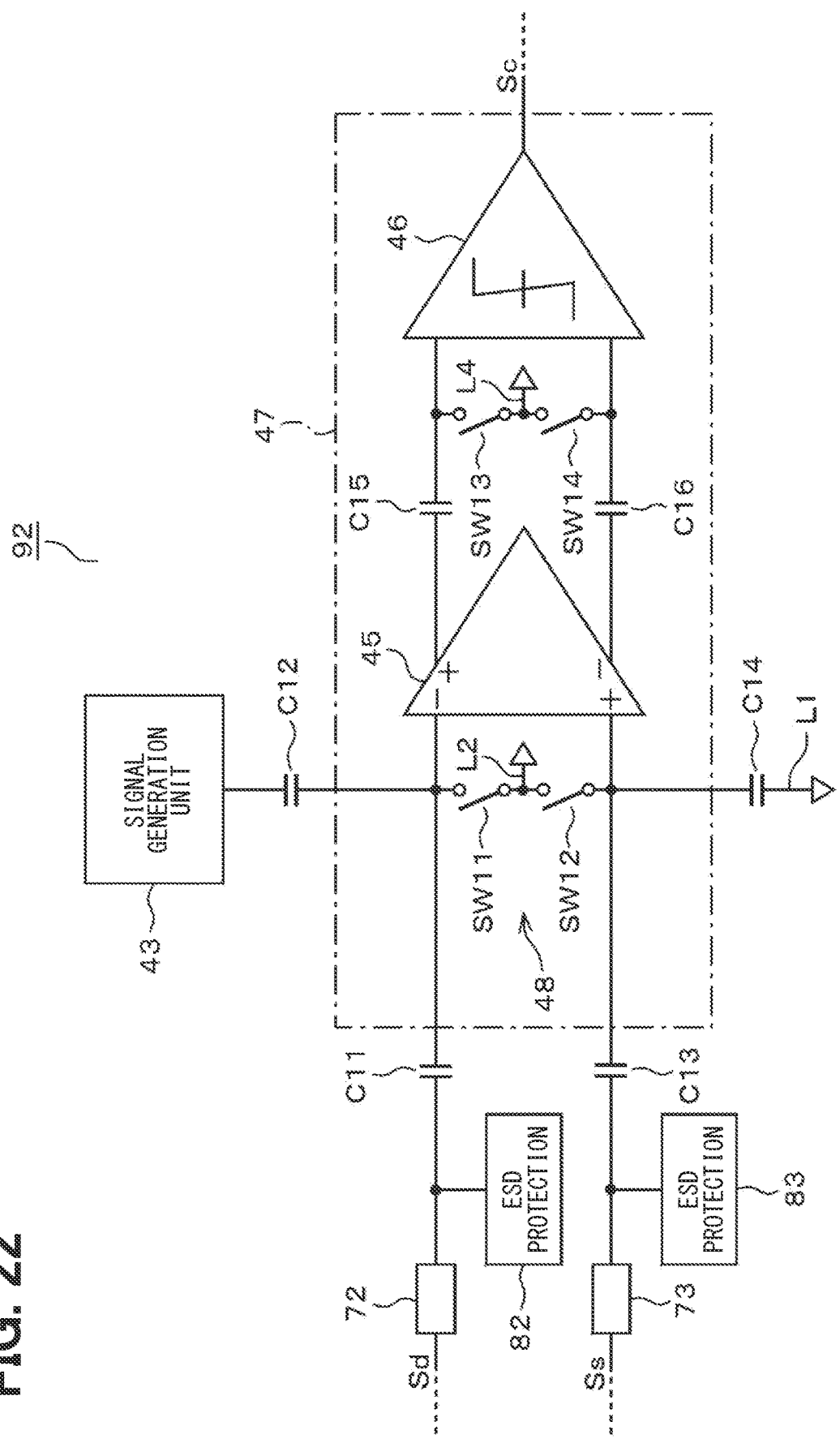
FIG. 22 is a diagram schematically showing a second configuration example of a signal detection circuit according to the ninth embodiment.

The following will describe a ninth embodiment of the present disclosure with reference to FIG. 21 and FIG. 22. In the ninth embodiment, a configuration of the signal detection circuit is changed from the second configuration example of the fourth embodiment. Similar change can also be made with respect to the first configuration example of the fourth embodiment.

The signal detection circuit of the present embodiment includes the ESD protection elements 82 and 83 similar to the signal detection circuit 81 of the eighth embodiment shown in FIG. 20, and also includes the resistors 72 and 73 similar to the signal detection circuit 71 of the seventh embodiment shown in FIG. 19. The following will describe two specific configuration examples in which the connection points of the ESD protection elements 82, 83 are different.

(First Configuration Example)

As shown in FIG. 21, in a signal detection circuit 91 of the first configuration example, the ESD protection element 82 is connected to the path between the drain of the switching element 2 and the resistor 72. The ESD protection element 83 is connected to the path between the source of the switching element 2 and the resistor 73.

(Second Configuration Example)

As shown in FIG. 22, in a signal detection circuit 92 of the second configuration example, the ESD protection element 82 is connected to the path between the resistor 72 and the capacitor C11. The ESD protection element 83 is connected to the path between the resistor 73 and the capacitor C13.

The present embodiment also provides the same effects as those of the fourth embodiment. In the signal detection circuit 91, 92 of the present embodiment, the resistors 72, 73 and the ESD protection elements 82, 83 are provided in the signal input stage. Therefore, influence of static electricity and the like on each element configuring the signal detection circuit 91, 92 can be further suppressed. According to the present embodiment, it is possible to realize ESD protection that protects each element configuring the signal detection circuit 91, 92 from ESD with higher reliability.

Other Embodiments

The present disclosure is not limited to the embodiments that have been described above and illustrated in the drawings, but can arbitrarily be modified, combined, or expanded without departing from the spirit of the present disclosure.

The numerical values and the like shown in the embodiments described above are examples, and are not limited to those examples.

The values of the reference potentials applied to the power supply lines L1, 2, L3, and L4 may be appropriately changed according to various specifications. Each reference potential may be set to a potential same as the potential of the DC power supply line LI connected to the source of the switching element 2, or may be set to a different potential. Each reference potential does not necessarily have to be set to the same potential. Alternatively, at least two reference potentials may be set to be different from one another. Further, the value of each reference potential, the value of the reference voltage Vref, the relationship between these values or the like are not limited to those examples described in each of the above embodiments, and may be appropriately changed according to the specifications of the actually applied device and the like.

For example, the value of the reference potential may be set to an intermediate value of the power supply voltage. This setting provide the following advantages. When the signal detection circuit 3 is operated only by the positive power supply instead of the positive and negative power supplies and the reference potential applied to the power supply line L2 is set to an intermediate value (for example, 2.5 Volts) of the power supply voltage (for example, 5 Volts), each signal having 0 Volts shown in FIG. 3 changes to have a voltage of 2.5 Volts, and the signal having −2 Volts shown in FIG. 3 changes to have a voltage of 0.5 Volts. Since the reference voltage Vref can be changed from −2 Volts to 0.5 Volts, the configuration of the signal generation unit 6 can be simplified compared with the configuration related to FIG. 3.

Among two switching elements constituting the half-bridge circuit, the drive target of the drive circuit 1, 41 may be the switching element disposed on the high side. In this case, according to the signal detection circuit 3, 42 of each of the above-described embodiments, it is possible to detect the detection target signal. Herein, the detection target signal is the signal of the main terminal of the switching element to be driven by the drive circuit 1, 41.

A switch may be provided in front stage of the signal inputs of the signal detection circuit 42A, 42B. The signal generation unit generating the reference signal is not limited to the configuration including the DAC described in each of the above embodiments. Various configurations such as a bandgap reference circuit, that is, a configuration including a BGR may be adopted as the signal generation unit.

The comparator 46 included in the detection circuit 47 is not limited to the configurations shown in the foregoing embodiments. Alternatively, a comparator configured to determine output level based on the input potential difference may be adopted in the detection circuit. In this case, the values of the two threshold voltages corresponding to the two input signals for the comparator may be set according to the reference voltage Vref.

Although the present disclosure has been described in accordance with embodiments, it is understood that the present disclosure is not limited to such embodiments or structures. The present disclosure incorporates various modifications and variations within the scope of equivalents. In addition, various combinations and configurations, as well as other combinations and configurations that include only one element, more, or less, are within the scope and spirit of the present disclosure.

What is claimed is:

1. A signal detection circuit that detects, as a detection target signal, a signal of a main terminal of a switching element by comparing the detection target signal with a reference signal, the signal detection circuit comprising:
a signal generation unit generating the reference signal;
a first capacitor having a first terminal connected with the main terminal of the switching element;
a second capacitor having a first terminal connected with an output terminal of the signal generation unit; and
a detection circuit receiving, as input signals, a signal output from a second terminal of the first capacitor and a signal output from a second terminal of the second capacitor, and the detection circuit detecting the detection target signal based on the input signals.

2. The signal detection circuit according to claim 1, wherein
the detection circuit includes a first input terminal and a second input terminal,
the signal output from the second terminal of the first capacitor is input to the first input terminal of the detection circuit, and
the signal output from the second terminal of the second capacitor is input to the second input terminal of the detection circuit.

3. The signal detection circuit according to claim 1, further comprising:
a third capacitor having a first terminal connected with another main terminal of the switching element, the main terminal of the switching element corresponding to a first main terminal and another main terminal of the switching element corresponding to a second main terminal; and
a fourth capacitor having a first terminal connected with a predetermined reference potential,
wherein
the detection circuit has a differential configuration,
the detection receives, as the input signals, the signal output from the second terminal of the first capacitor, the signal output from the second terminal of the second capacitor, a signal output from a second terminal of the third capacitor, and a signal output from a second terminal of the fourth capacitor, and
the detection circuit detects the detection target signal based on the input signals.

4. The signal detection circuit according to claim 3, wherein
the detection circuit includes a first input terminal and a second input terminal, and
in a case where a signal fluctuation amount of the second main terminal of the switching element is smaller than a signal fluctuation amount of the first main terminal of the switching element,
the signal output from the second terminal of the first capacitor and the signal output from the second terminal of the fourth capacitor are input to the first input terminal of the detection circuit, and
the signal output from the second terminal of the second capacitor and the signal output from the second terminal of the third capacitor are input to the second input terminal of the detection circuit.

5. The signal detection circuit according to claim 3, wherein
the detection circuit includes:
an amplifier that receives, as input signals, the signal from the second terminal of the first capacitor and the signal from the second terminal of the third capacitor, the amplifier amplifying the input signals and outputting the amplified signals as output signals;
a comparator receiving the output signals output from the amplifier;
an identical signal input unit that inputs identical signals to input terminals of the amplifier;
a storage capacitor having a first terminal connected with an output terminal of the amplifier and a second terminal connected with an input terminal of the comparator; and
a switch connecting the second terminal of the storage capacitor to the predetermined reference potential.

6. The signal detection circuit according to claim 3, wherein
the first terminal of the first capacitor is connected with the first main terminal of the switching element without an electrically openable closable switch, and
the first terminal of the third capacitor is connected with the second main terminal of the switching element without an electrically openable closable switch.

7. The signal detection circuit according to claim 3, further comprising:
a first passive element connected in series between the first terminal of the first capacitor and the first main terminal of the switching element; and
a second passive element connected in series between the first terminal of the third capacitor and the second main terminal of the switching element.

8. The signal detection circuit according to claim 3, further comprising:
a first static electricity protection unit connected to a path that connects the first terminal of the first capacitor and the first main terminal of the switching element; and
a second static electricity protection unit connected to a path that connects the first terminal of the third capacitor and the second main terminal of the switching element.

9. The signal detection circuit according to claim 1, wherein
the signal generation unit includes a digital-to-analog converter, and
the signal generation unit generates and outputs the reference signal based on an output of the digital-to-analog converter.

10. The signal detection circuit according to claim 9, wherein
the digital-to-analog converter has a capacitor array configuration.

* * * * *